US011581301B2

(12) United States Patent
Isobe et al.

(10) Patent No.: US 11,581,301 B2
(45) Date of Patent: Feb. 14, 2023

(54) ELECTROSTATIC PROTECTIVE ELEMENT AND ELECTRONIC DEVICE

(71) Applicants: SONY CORPORATION, Tokyo (JP); SONY SEMICONDUCTOR SOLUTIONS CORPORATION, Kanagawa (JP)

(72) Inventors: Hiroshi Isobe, Kanagawa (JP); Takaaki Tatsumi, Tokyo (JP)

(73) Assignees: SONY CORPORATION, Tokyo (JP); SONY SEMICONDUCTOR SOLUTIONS CORPORATION, Kanagawa (JP)

(*) Notice: Subject to any disclaimer, the term of this patent is extended or adjusted under 35 U.S.C. 154(b) by 130 days.

(21) Appl. No.: 17/050,046

(22) PCT Filed: Apr. 18, 2019

(86) PCT No.: PCT/JP2019/016580
§ 371 (c)(1),
(2) Date: Oct. 23, 2020

(87) PCT Pub. No.: WO2019/211989
PCT Pub. Date: Nov. 7, 2019

(65) Prior Publication Data
US 2021/0111172 A1 Apr. 15, 2021

(30) Foreign Application Priority Data

May 1, 2018 (JP) .............................. JP2018-088013
Dec. 12, 2018 (JP) .............................. JP2018-232225

(51) Int. Cl.
*H01L 27/02* (2006.01)
*H01L 29/735* (2006.01)

(52) U.S. Cl.
CPC ........ *H01L 27/0248* (2013.01); *H01L 29/735* (2013.01)

(58) Field of Classification Search
CPC .......................... H01L 27/0248; H01L 29/735
See application file for complete search history.

(56) References Cited

U.S. PATENT DOCUMENTS

| | | | |
|---|---|---|---|
| 2007/0210419 A1* | 9/2007 | Nawate | ................ H01L 29/735 |
| | | | 257/E29.187 |
| 2010/0187608 A1 | 7/2010 | Risaki et al. | |
| 2014/0225157 A1 | 8/2014 | Kuo et al. | |
| 2014/0339676 A1 | 11/2014 | Kuo et al. | |

FOREIGN PATENT DOCUMENTS

| | | |
|---|---|---|
| CN | 101826512 A | 9/2010 |
| EP | 2214206 A2 | 8/2010 |

(Continued)

OTHER PUBLICATIONS

International Search Report and Written Opinion of PCT Application No. PCT/JP2019/016580, dated May 21, 2019, 09 pages of ISRWO.

*Primary Examiner* — Matthew C Landau
*Assistant Examiner* — Mark Hatzilambrou
(74) *Attorney, Agent, or Firm* — Chip Law Group

(57) ABSTRACT

The present technique relates to an electrostatic protective element that enables protective performance with respect to static electricity to be improved and to an electronic device. An electrostatic protective element includes: a first impurity region of a first conductivity type which is formed on the predetermined surface side of a semiconductor substrate; a second impurity region of a second conductivity type which is formed on the predetermined surface side of the semiconductor substrate so as to form a clearance in a horizontal direction with respect to the first impurity region; a collector contact which is formed on the predetermined surface side in the first impurity region, which has a higher concentration (Continued)

than the first impurity region, and which is an impurity region of the first conductivity type; a base contact which is formed on the predetermined surface side in the second impurity region, which has a higher concentration than the second impurity region, and which is an impurity region of the second conductivity type; and an emitter contact which is formed on the predetermined surface side in the second impurity region at a position that is closer to the collector contact than the base contact, which has a higher concentration than the second impurity region, and which is an impurity region of the first conductivity type. The present technique can be applied to, for example, an electronic device.

11 Claims, 22 Drawing Sheets

(56) References Cited

FOREIGN PATENT DOCUMENTS

| | | |
|---|---|---|
| JP | 2004-335634 A | 11/2004 |
| JP | 2007-242923 A | 9/2007 |
| JP | 2010-177434 A | 8/2010 |
| JP | 2013-172085 A | 9/2013 |
| JP | 2013-191767 A | 9/2013 |
| KR | 10-2010-0088087 A | 8/2010 |
| TW | 201041120 A | 11/2010 |

* cited by examiner

ELECTROSTATIC PROTECTIVE ELEMENT AND ELECTRONIC DEVICE

CROSS REFERENCE TO RELATED APPLICATIONS

This application is a U.S. National Phase of International Patent Application No. PCT/JP2019/016580 filed on Apr. 18, 2019, which claims priority benefit of Japanese Patent Application No. JP 2018-232225 filed in the Japan Patent Office on Dec. 12, 2018 and also claims priority benefit of Japanese Patent Application No. JP 2018-088013 filed in the Japan Patent Office on May 1, 2018. Each of the above-referenced applications is hereby incorporated herein by reference in its entirety.

TECHNICAL FIELD

The present technique relates to an electrostatic protective element and an electronic device and, particularly, to a BJT (Bipolar Junction Transistor)-type electrostatic protective element and an electronic device provided with a BJT-type electrostatic protective element.

BACKGROUND ART

Conventionally, a BJT-type electrostatic protective element is known as a type of static electricity (Electro Static Discharge) protective element (for example, refer to PTL 1 and 2).

CITATION LIST

Patent Literature

[PTL 1]
JP 2007-242923A
[PTL 2]
JP 2013-172085A

SUMMARY

Technical Problem

An electrostatic protective element described in PTL 1 has a structure in which impurity regions constituting an emitter, a base, and a collector are lined up in a longitudinal direction (a depth direction), and snapback voltage is set based on a concentration and a thickness of the impurity regions. However, in the electrostatic protective element described in PTL 1, since a thickness of an impurity concentration is limited from the perspective of downsizing and the snapback voltage cannot be set that high, the electrostatic protective element cannot be applied to a high withstand voltage circuit.

An electrostatic protective element described in PTL 2 has a lateral structure in which impurity regions constituting an emitter, a base, and a collector are lined up in a lateral direction, and snapback voltage is set based on a separation distance in a horizontal direction between the impurity region that constitutes the collector and the impurity region that constitutes the base. However, in the electrostatic protective element described in PTL 2, since a concentration of a P-well in a layer below the impurity region described above is high, it is difficult to control the snapback voltage according to the separation distance described above. In addition, in the electrostatic protective element described in PTL 2, since the collector and the base are adjacent to each other, there is a risk that the collector and the base may become short-circuited and a bipolar operation may not be performed.

The present technique has been devised in consideration of the situations described above and an object thereof is to improve protective performance with respect to static electricity.

Solution to Problem

An electrostatic protective element according to a first aspect of the present technique includes: a first impurity region of a first conductivity type which is formed on a predetermined surface side of a semiconductor substrate; a second impurity region of a second conductivity type which is formed on the predetermined surface side of the semiconductor substrate so as to form a clearance in a horizontal direction with respect to the first impurity region; a collector contact which is formed on a predetermined surface side in the first impurity region, which has a higher concentration than the first impurity region, and which is an impurity region of the first conductivity type; a base contact which is formed on a predetermined surface side in the second impurity region, which has a higher concentration than the second impurity region, and which is an impurity region of the second conductivity type; and an emitter contact which is formed on a predetermined surface side in the second impurity region at a position that is closer to the collector contact than the base contact, which has a higher concentration than the second impurity region, and which is an impurity region of the first conductivity type.

An electronic device according to a second aspect of the present technique includes a semiconductor apparatus that is provided with an electrostatic protective element, wherein the electrostatic protective element includes: a first impurity region of a first conductivity type which is formed on a predetermined surface side of a semiconductor substrate; a second impurity region of a second conductivity type which is formed on the predetermined surface side of the semiconductor substrate so as to form a clearance in a horizontal direction with respect to the first impurity region; a collector contact which is formed on a predetermined surface side in the first impurity region, which has a higher concentration than the first impurity region, and which is an impurity region of the first conductivity type; a base contact which is formed on a predetermined surface side in the second impurity region, which has a higher concentration than the second impurity region, and which is an impurity region of the second conductivity type; and an emitter contact which is formed on a predetermined surface side in the second impurity region at a position that is closer to the collector contact than the base contact, which has a higher concentration than the second impurity region, and which is an impurity region of the first conductivity type.

In the first aspect or the second aspect of the present technique, a leakage current flows between the collector contact and the base contact, potential of the second impurity region rises or drops, and a collector current flows between the collector contact and the emitter contact.

Advantageous Effects of Invention

According to the first aspect or the second aspect of the present technique, protective performance with respect to static electricity improves.

DESCRIPTION OF EMBODIMENTS

Hereinafter, modes (hereinafter, referred to as embodiments) for implementing the present technique will be described. The descriptions will be given in the following order.

1. Example of BJT-type electrostatic protective element
2. First embodiment (example of NPN type)
3. Second embodiment (example of PNP type)
4. Third embodiment (first example of countermeasure against heat generation of NPN type)
5. Fourth embodiment (second example of countermeasure against heat generation of NPN type)
6. Fifth embodiment (third example of countermeasure against heat generation of NPN type)
7. Sixth embodiment (first example of countermeasure against heat generation of PNP type)
8. Seventh embodiment (second example of countermeasure against heat generation of PNP type)
9. Eighth embodiment (third example of countermeasure against heat generation of PNP type)
10. Ninth embodiment (first example of multi-finger type)
11. Tenth embodiment (second example of multi-finger type)
12. Eleventh embodiment (fourth example of countermeasure against heat generation of NPN type)
13. Modifications
14. Other <<1. Example of BJT-Type Electrostatic Protective Element>>

First, an example of a BJT-type electrostatic protective element will be described with reference to FIGS. 1, 2A, and 2B.

<Configuration Example of Electrostatic Protective Element 1>

Figure 1:
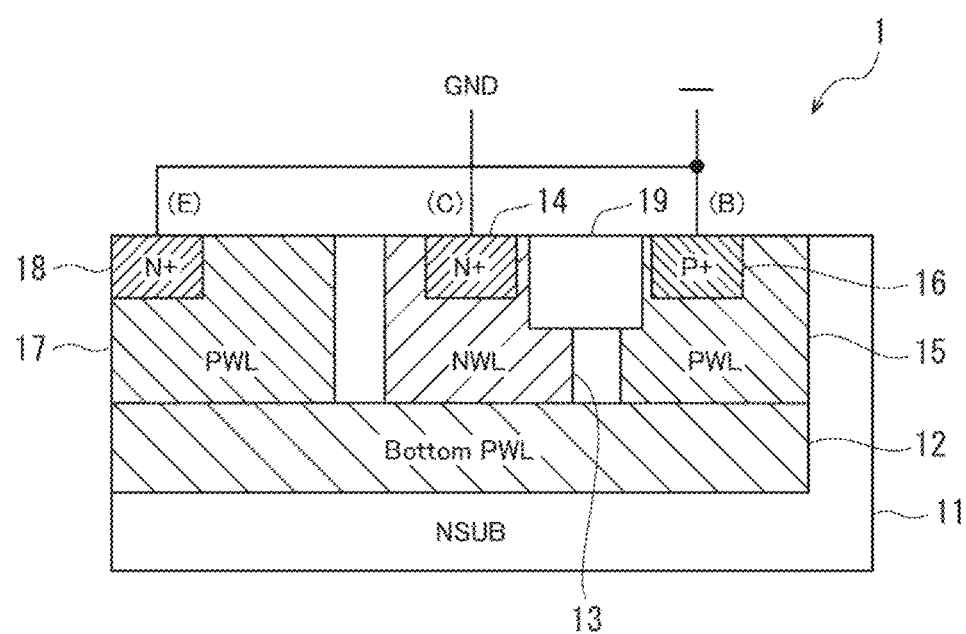
FIG. 1 is a sectional view schematically showing an example of an electrostatic protective element.

FIG. 1 is a sectional view schematically showing a configuration example of a BJT-type electrostatic protective element 1.

Hereinafter, a surface on an upper side of a semiconductor substrate 11 in the diagram will be referred to as a front surface and a surface on a lower side will be referred to as a rear surface. The same description will apply to subsequent drawings.

In addition, symbols "P" and "N" in the diagrams respectively indicate a P-type impurity region (a P-type semiconductor region) and an N-type impurity region (a N-type semiconductor region). Furthermore, "+" or "−" at the end of the symbols "P+", "P−" and "N+", "N−" indicate an impurity concentration of the P-type impurity region and the N-type impurity region. "+" indicates that the impurity concentration is high and "−" indicates that the impurity concentration is low. A case where neither "+" nor "−" is added indicates an intermediate impurity concentration. The same description will apply to subsequent drawings.

The electrostatic protective element 1 constitutes a semiconductor apparatus together with other circuits (not illustrated) that are formed on the N-type semiconductor substrate 11 and protects at least a part of the other circuits from static electricity.

The electrostatic protective element 1 is constituted by a bottom P-well (Bottom PWL) 12, an N-well (NWL) 13, a collector contact 14, a P-well (PWL) 15, a base contact 16, a P-well (PWL) 17, an emitter contact 18, and a trench 19 which are formed on the semiconductor substrate 11.

The bottom P-well 12 is a P-type impurity region. The bottom P-well 12 is formed at a deeper position than the N-well 13, the P-well 15, and the P-well 17 and at least covers bottom surfaces of the N-well 13, the P-well 15, and the P-well 17.

The N-well 13 is an N-type impurity region and has a higher concentration (a higher impurity concentration) than the bottom P-well 12. The N-well 13 is formed on a front surface side of the semiconductor substrate 11.

The collector contact 14 is an N-type impurity region and has a higher concentration than the N-well 13. The collector contact 14 is formed on the front surface side of the semiconductor substrate 11 inside the N-well 13 and is shallower and smaller in terms of an area in a horizontal direction than the N-well 13. The collector contact 14 becomes a collector terminal of an NPN-type bipolar transistor that constitutes the electrostatic protective element 1 and is connected to, for example, ground.

The P-well 15 is a P-type impurity region and has an impurity concentration which is higher than the bottom P-well 12 and which is approximately the same as the N-well 13. The P-well 15 is formed on the front surface side of the semiconductor substrate 11 at a position that is separated by a predetermined interval in the horizontal direction from the N-well 13. The P-well 15 has approximately the same depth as the N-well 13.

The base contact 16 is a P-type impurity region and has an impurity concentration which is higher than the P-well 15 and which is approximately the same as the collector contact 14. The base contact 16 is formed on the front surface side of the semiconductor substrate 11 inside the P-well 15 and is shallower and smaller in terms of an area in the horizontal direction than the P-well 15. In addition, the base contact 16 has approximately the same depth as the collector contact 14. The base contact 16 becomes a base terminal of the bipolar transistor that constitutes the electrostatic protective element 1 and, for example, negative voltage is applied thereto.

The P-well 17 is a P-type impurity region and has an impurity concentration which is higher than the bottom P-well 12 and which is approximately the same as the N-well 13 and the P-well 15. The P-well 17 is formed on the front surface side of the semiconductor substrate 11 on an opposite side to the P-well 15 with respect to the N-well 13 at a position that is separated by a predetermined interval in the horizontal direction from the N-well 13. The P-well 17 has approximately the same depth as the N-well 13 and the P-well 15.

The emitter contact 18 is a P-type impurity region and has an impurity concentration which is higher than the P-well 17 and which is approximately the same as the collector contact 14 and the base contact 16. The emitter contact 18 is formed on the front surface side of the semiconductor substrate 11 inside the P-well 17 and is shallower and smaller in terms of an area in the horizontal direction than the P-well 17. In addition, the emitter contact 18 has approximately the same depth as the collector contact 14 and the base contact 16. The emitter contact 18 becomes an emitter terminal of the bipolar transistor that constitutes the electrostatic protective element 1 and, for example, negative voltage is applied thereto together with the base contact 16.

The trench 19 is formed between the collector contact 14 and the base contact 16 and prevents short-circuiting of the collector contact 14 and the base contact 16.

The N-well 13 and the collector contact 14 constitute a collector of the bipolar transistor that constitutes the electrostatic protective element 1. The bottom P-well 12, the P-well 15, the base contact 16, and the P-well 17 constitute a base of the bipolar transistor that constitutes the electrostatic protective element 1. The emitter contact 18 constitutes an emitter of the bipolar transistor that constitutes the electrostatic protective element 1.

<Operation of Electrostatic Protective Element 1>

Next, an operation of the electrostatic protective element 1 will be described with reference to FIGS. 2A and 2B.

Figure 2A:
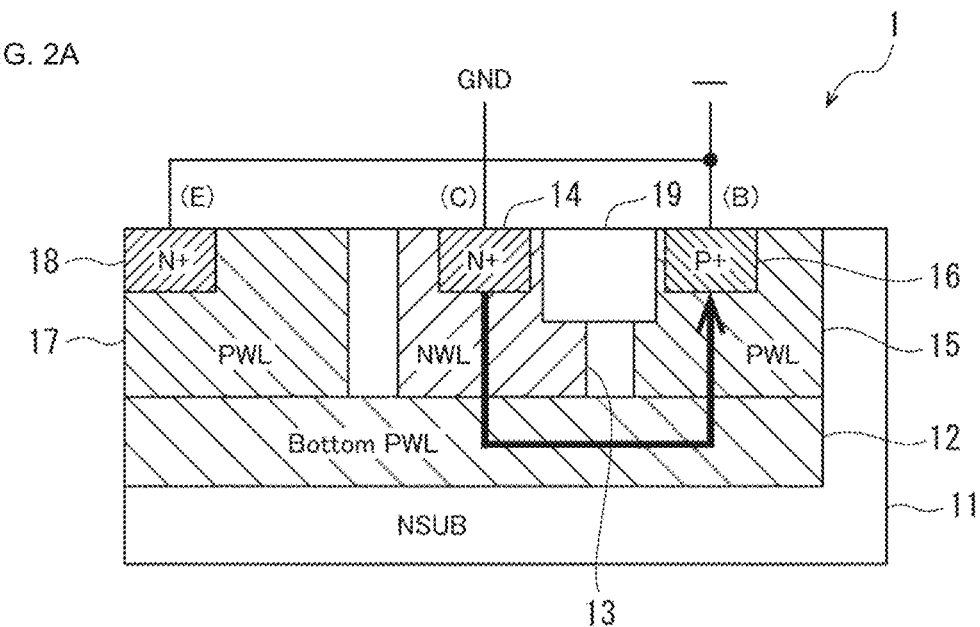
FIGS. 2A and 2B are diagrams for explaining an operation of the electrostatic protective element shown in FIG. 1.
Figure 2B:
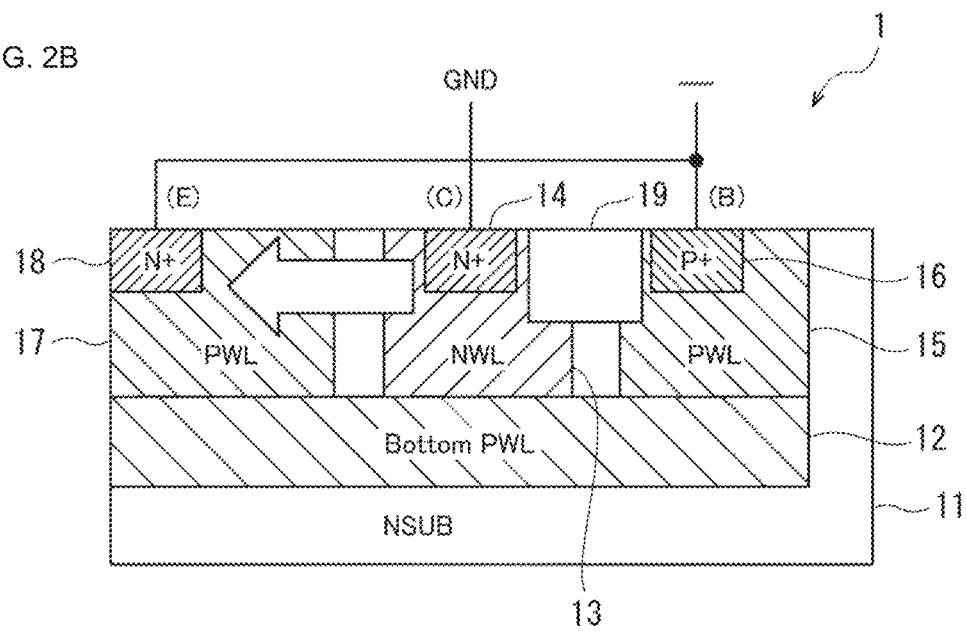

When static electricity causes large negative voltage that is equal to or larger than a predetermined value to be applied to the base contact 16 and the emitter contact 18, a breakdown occurs and, as indicated by an arrow in FIG. 2A, a leakage current flows along a path sequentially formed by the collector contact 14, the N-well 13, the bottom P-well 12, the P-well 15, and the base contact 16.

The leakage current causes potential of the P-well 17 to rise and, when a predetermined potential is reached or exceeded, a negative charge of the emitter contact 18 flows into the collector contact 14 via the P-well 17 and the N-well 13. In other words, the bipolar transistor that constitutes the electrostatic protective element 1 is turned on (starts a bipolar operation) and, as indicated by an arrow in FIG. 2B, a collector current flows along a path sequentially formed by the collector contact 14, the N-well 13, the P-well 17, and the emitter contact 18. Accordingly, an overcurrent caused by static electricity is prevented from flowing into a circuit to be a protection object of the electrostatic protective element 1 and the circuit is protected.

A negative voltage value that is applied to the base contact 16 and the emitter contact 18 when the collector current starts to flow is adopted as snapback voltage.

Since the collector contact 14 and the base contact 16 are adjacent to each other in the electrostatic protective element 1, the trench 19 must be provided in order to prevent short-circuiting between the two as described earlier.

In addition, as shown in FIG. 2A, since the leakage current flows via the bottom P-well 12, a voltage drop thereof is likely to generate a snapback. Therefore, with the electrostatic protective element 1, it is difficult to increase the snapback voltage.

<<2. First Embodiment>>

Next, a first embodiment of the present technique will be described with reference to FIGS. 3, 4A, and 4B.

<Configuration Example of Electrostatic Protective Element 101>

Figure 3:
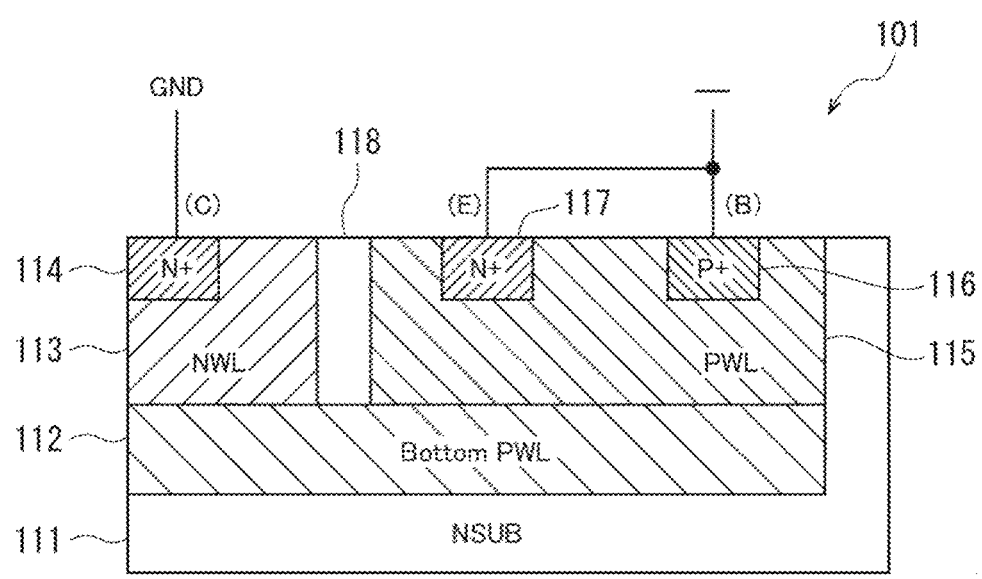
FIG. 3 is a sectional view schematically showing a first embodiment of an electrostatic protective element to which the present technique has been applied.

FIG. 3 is a sectional view schematically showing a configuration example of an electrostatic protective element 101 that represents a first embodiment of the present technique.

The electrostatic protective element 101 constitutes a semiconductor apparatus together with other circuits (not illustrated) that are formed on an N-type semiconductor substrate 111 and protects at least a part of the other circuits from static electricity.

It should be noted that circuits to be protection targets of the electrostatic protective element 101 include circuits constituted by a single element. In addition, an impurity concentration of the semiconductor substrate 111 is set to, for example, around $1.0 \times 10^{14}/cm^3$.

The electrostatic protective element 101 is constituted by a bottom P-well (Bottom PWL) 112, an N-well (NWL) 113, a collector contact 114, a P-well (PWL) 115, a base contact 116, and an emitter contact 117 which are formed on the semiconductor substrate 111.

The bottom P-well 112 is a P-type impurity region. The bottom P-well 112 is formed at a deeper position than the N-well 113 and the P-well 115 and at least covers bottom surfaces of the N-well 113 and the P-well 115.

The N-well 113 is an N-type impurity region and has a higher concentration than the bottom P-well 112. The N-well 113 is formed on a front surface side of the semiconductor substrate 111.

The collector contact 114 is an N-type impurity region and has a higher concentration than the N-well 113. The collector contact 114 is formed on the front surface side of the semiconductor substrate 111 inside the N-well 113 and is shallower and smaller in terms of an area in the horizontal direction than the N-well 113. The collector contact 114 becomes a collector terminal of an NPN-type bipolar transistor that constitutes the electrostatic protective element 101 and is connected to, for example, ground.

The P-well 115 is a P-type impurity region and has an impurity concentration which is higher than the bottom P-well 112 and which is approximately the same as the N-well 113. The P-well 115 is formed on the front surface side of the semiconductor substrate 111 so as to be separated by a clearance 118 with a predetermined width in the horizontal direction from the N-well 113. The P-well 115 has approximately the same depth as the N-well 113.

The base contact 116 is a P-type impurity region and has an impurity concentration which is higher than the P-well 115 and which is approximately the same as the collector contact 114. The base contact 116 is formed on the front surface side of the semiconductor substrate 111 inside the P-well 115 and is shallower and smaller in terms of an area in the horizontal direction than the P-well 115. In addition, the base contact 116 has approximately the same depth as the collector contact 114. The base contact 116 becomes a base terminal of the bipolar transistor that constitutes the electrostatic protective element 101 and, for example, negative voltage is applied thereto.

The emitter contact 117 is an N-type impurity region and has an impurity concentration which is higher than the P-well 115 and which is approximately the same as the collector contact 114 and the base contact 116. The emitter contact 117 is formed inside the P-well 115 on the front surface side of the semiconductor substrate 111 and at a position that is closer to the collector contact 114 than the base contact 116 so as to be separated by a predetermined interval from the base contact 116. The emitter contact 117 is shallower and smaller in terms of an area in the horizontal direction than the P-well 115 and has approximately the same depth as the collector contact 114 and the base contact 116. The emitter contact 117 becomes an emitter terminal of the bipolar transistor that constitutes the electrostatic protective element 101 and, for example, negative voltage is applied thereto together with the base contact 116.

The clearance 118 is a depletion layer and separates the N-well 113 and the P-well 115 from each other.
<Operation of Electrostatic Protective Element 101>

Next, an operation of the electrostatic protective element 101 will be described with reference to FIGS. 4A and 4B.

Figure 4A:
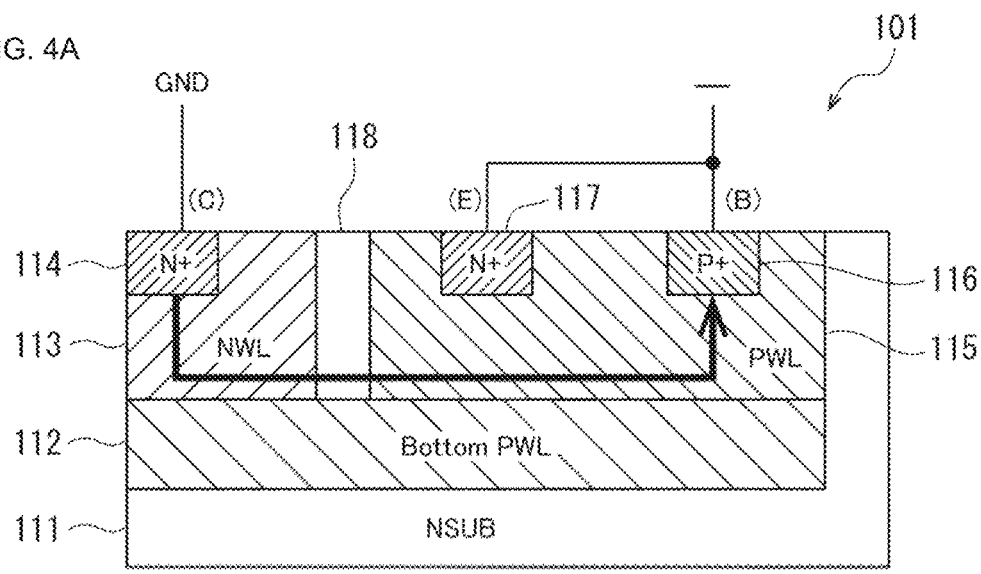
FIGS. 4A and 4B are diagrams for explaining an operation of the electrostatic protective element shown in FIG. 3.
Figure 4B:
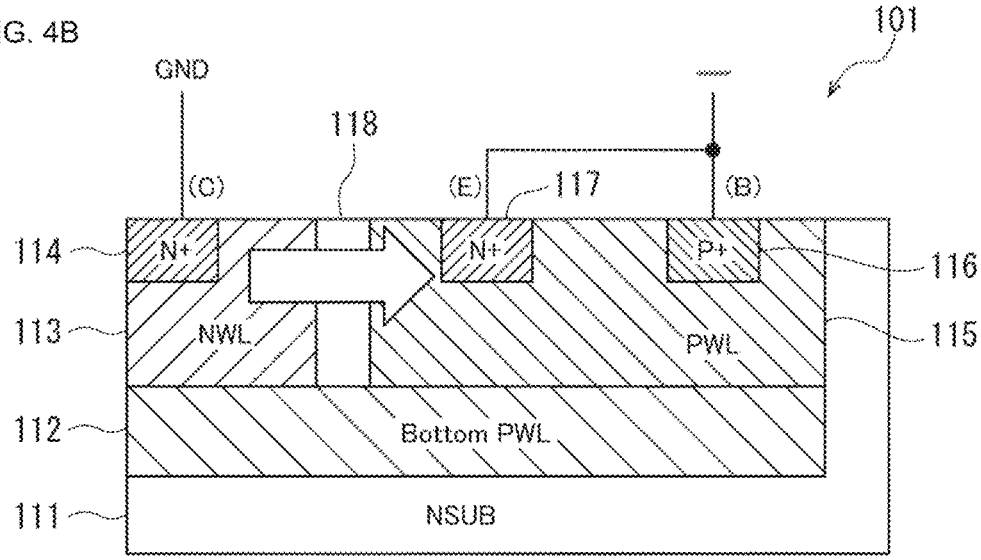

When static electricity causes large negative voltage that is equal to or larger than a predetermined value to be applied to the base contact 116 and the emitter contact 117, a breakdown occurs and, as indicated by an arrow in FIG. 4A, a leakage current flows along a path sequentially formed by the collector contact 114, the N-well 113, the P-well 115, and the base contact 116.

The leakage current causes potential of the P-well 115 to rise and, when a predetermined potential is reached or exceeded, a negative charge of the emitter contact 117 flows into the collector contact 114 via the P-well 115 and the N-well 113. In other words, the bipolar transistor that constitutes the electrostatic protective element 101 is turned on (starts a bipolar operation) and, as indicated by an arrow in FIG. 4B, a collector current flows along a path sequentially formed by the collector contact 114, the N-well 113, the P-well 115, and the emitter contact 117. Accordingly, an overcurrent caused by static electricity is prevented from flowing into a circuit to be a protection object of the electrostatic protective element 101 and the circuit is protected.

A negative voltage value that is applied to the base contact 116 and the emitter contact 117 when the collector current starts to flow is adopted as snapback voltage.

The electrostatic protective element 101 has improved protective performance with respect to static electricity and the like as compared to the electrostatic protective element 1 shown in FIG. 1.

Specifically, in the electrostatic protective element 101, since the emitter contact 117 is arranged between the collector contact 114 and the base contact 116, short-circuiting of the collector contact 114 and the base contact 116 is unlikely to occur. This eliminates the need to provide a trench between the collector contact 114 and the base contact 116 as in the electrostatic protective element 101 shown in FIG. 1. Accordingly, a manufacturing step is eliminated and manufacturing cost is reduced.

In addition, as shown in FIG. 4A, since the leakage current does not flow via the bottom P-well 112, a resistance value is reduced and, as a result, snapback voltage can be increased. Therefore, the electrostatic protective element 101 can be better applied to high withstand voltage circuits than the electrostatic protective element 1. In addition, the snapback voltage can be adjusted to an appropriate value in accordance with the width of the clearance 118.

Furthermore, since the leakage current does not flow via the bottom P-well 112, the electrostatic protective element 101 can also be applied to a semiconductor apparatus that does not include the bottom P-well 112.
<<3. Second Embodiment>>

Next, a second embodiment of the present technique will be described with reference to FIGS. 5, 6A, and 6B. The second embodiment represents reversed polarities of the impurity regions of the first embodiment.
<Configuration Example of Electrostatic Protective Element 201>

Figure 5:
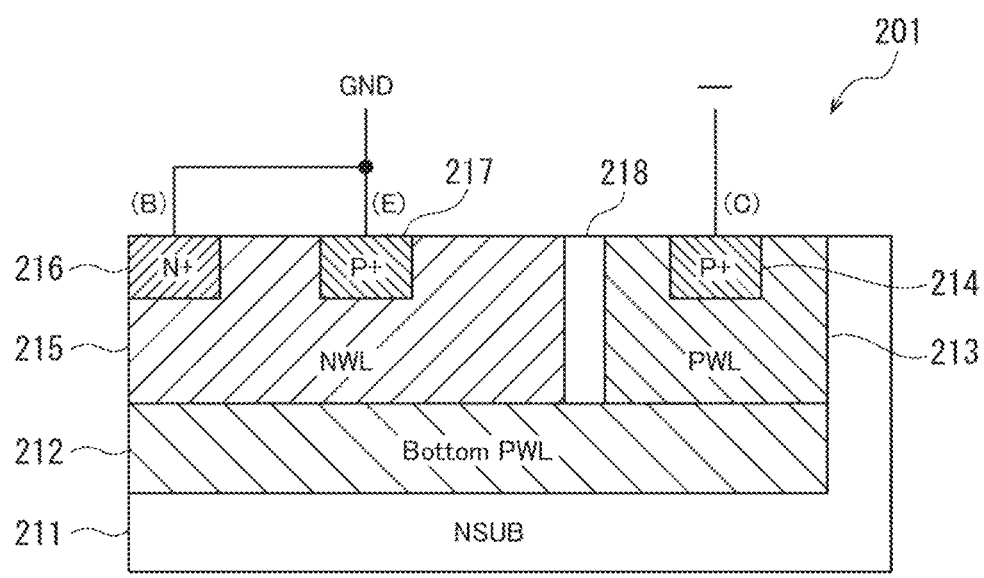
FIG. 5 is a sectional view schematically showing a second embodiment of an electrostatic protective element to which the present technique has been applied.

FIG. 5 is a sectional view schematically showing a configuration example of an electrostatic protective element 201 that represents the second embodiment of the present technique.

The electrostatic protective element 201 is constituted by a bottom P-well (Bottom PWL) 212, a P-well (PWL) 213, a collector contact 214, an N-well (NWL) 215, a base contact 216, and an emitter contact 217 which are formed on a semiconductor substrate 211. An impurity concentration of the semiconductor substrate 211 is set to, for example, around $1.0 \times 10^{14}/cm^3$.

The bottom P-well 212 is a P-type impurity region. The bottom P-well 212 is formed at a deeper position than the P-well 213 and the N-well 215 and at least covers bottom surfaces of the P-well 213 and the N-well 215.

The P-well 213 is a P-type impurity region and has a higher concentration than the bottom P-well 212. The P-well 213 is formed on a front surface side of the semiconductor substrate 211.

The collector contact 214 is a P-type impurity region and has a higher concentration than the P-well 213. The collector contact 214 is formed on the front surface side of the semiconductor substrate 211 inside the P-well 213 and is shallower and smaller in terms of an area in the horizontal direction than the P-well 213. The collector contact 214 becomes a collector terminal of a PNP-type bipolar transistor that constitutes the electrostatic protective element 201 and, for example, negative voltage is applied thereto.

The N-well 215 is an N-type impurity region and has an impurity concentration which is higher than the bottom P-well 212 and which is approximately the same as the P-well 213. The N-well 215 is formed on the front surface side of the semiconductor substrate 211 so as to be separated by a clearance 218 with a predetermined width in the horizontal direction from the P-well 213, and has approximately the same depth as the P-well 213.

The base contact 216 is an N-type impurity region and has an impurity concentration which is higher than the N-well 215 and which is approximately the same as the collector contact 214. The base contact 216 is formed on the front surface side of the semiconductor substrate 211 inside the N-well 215 and is shallower and smaller in terms of an area in the horizontal direction than the N-well 215. In addition, the base contact 216 has approximately the same depth as the collector contact 214. The base contact 216 becomes a base terminal of the bipolar transistor that constitutes the electrostatic protective element 201 and is connected to, for example, ground.

The emitter contact 217 is a P-type impurity region and has an impurity concentration which is higher than the N-well 215 and which is approximately the same as the collector contact 214 and the base contact 216. The emitter contact 217 is formed inside the N-well 215 on the front surface side of the semiconductor substrate 211 and at a position that is closer to the collector contact 214 than the base contact 216 so as to be separated by a predetermined interval from the base contact 216. The emitter contact 217 is shallower and smaller in terms of an area in the horizontal direction than the N-well 215 and has approximately the same depth as the collector contact 214 and the base contact 216. The emitter contact 217 becomes an emitter terminal of the bipolar transistor that constitutes the electrostatic protective element 201 and is connected to, for example, ground.

The clearance 218 is a depletion layer and separates the P-well 213 and the N-well 215 from each other.

<Operation of Electrostatic Protective Element 201>

Next, an operation of the electrostatic protective element 201 will be described with reference to FIGS. 6A and 6B.

Figure 6A:
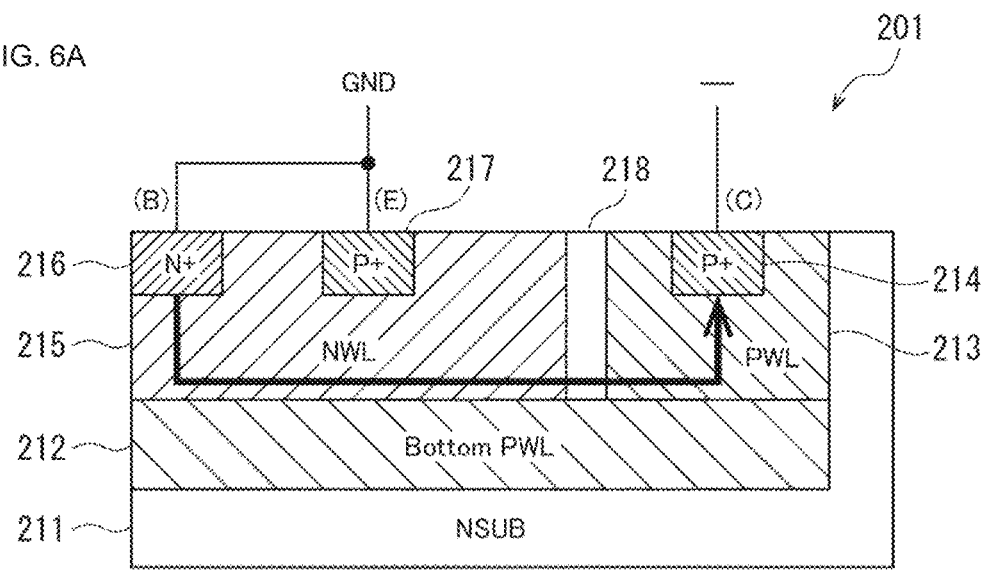
FIGS. 6A and 6B are diagrams for explaining an operation of the electrostatic protective element shown in FIG. 5.
Figure 6B:
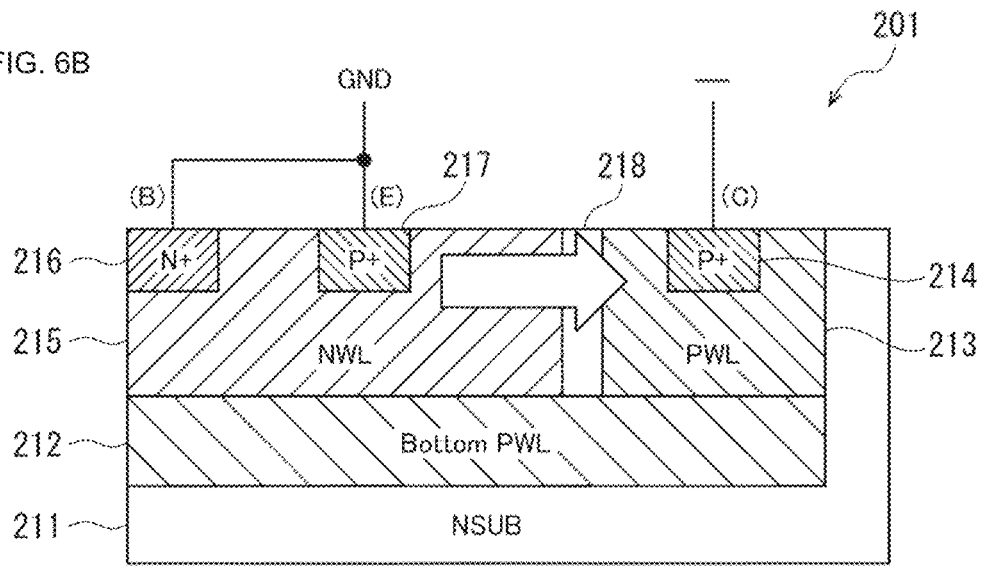

When static electricity causes large negative voltage that is equal to or larger than a predetermined value to be applied to the collector contact 214, a breakdown occurs and, as indicated by an arrow in FIG. 6A, a leakage current flows along a path sequentially formed by the base contact 216, the N-well 215, the P-well 213, and the collector contact 214.

The leakage current causes potential of the N-well 215 to drop and, when the potential reaches or falls below a predetermined potential, a positive charge of the emitter contact 217 flows into the collector contact 214 via the N-well 215 and the P-well 213. In other words, the bipolar transistor that constitutes the electrostatic protective element 201 is turned on (starts a bipolar operation) and, as indicated by an arrow in FIG. 6B, a collector current flows along a path sequentially formed by the emitter contact 217, the N-well 215, the P-well 213, and the collector contact 214. Accordingly, an overcurrent caused by static electricity is prevented from flowing into a circuit to be a protection object of the electrostatic protective element 201 and the circuit is protected.

A negative voltage value that is applied to the collector contact 214 when the collector current described above starts to flow is adopted as snapback voltage.

The electrostatic protective element 201 represents reverse polarities of the impurity regions of the electrostatic protective element 101 and is capable of producing operational advantages similar to those of the electrostatic protective element 101.

<<4. Third Embodiment>>

Next, a third embodiment of the present technique will be described with reference to FIGS. 7A, 7B, 8A, 8B, 9A, and 9B.

Figure 7A:
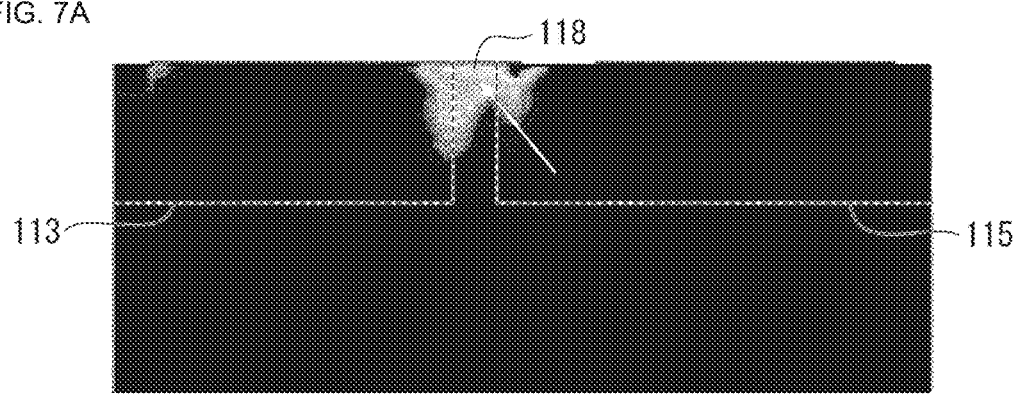
FIGS. 7A and 7B are diagrams showing a heat generation distribution and a current density distribution when surface density of the electrostatic protective element shown in FIG. 3 is high.
Figure 7B:
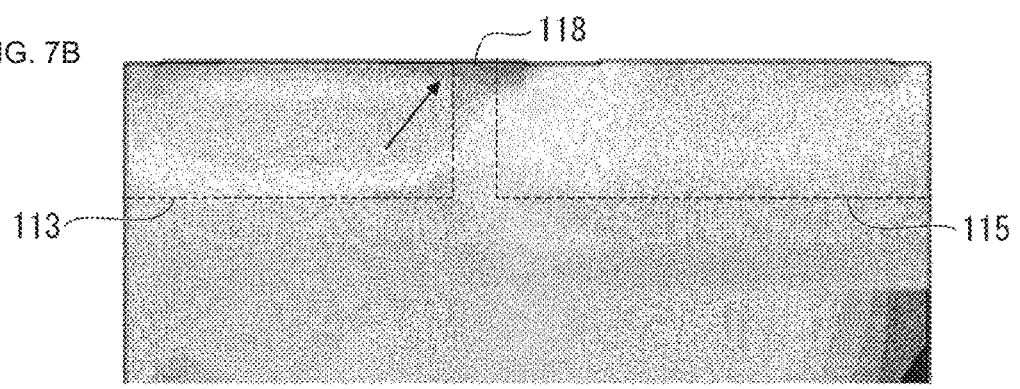

FIGS. 7A and 7B show an example of a heat generation distribution and a current density distribution when an impurity concentration of a surface (hereinafter, referred to as surface concentration) of the electrostatic protective element 101 (mainly, the N-well 113 and the P-well 115) is high. Specifically, FIG. 7A shows a heat generation distribution during a bipolar operation of the electrostatic protective element 101, in which the larger an amount of heat generation (the higher a temperature) of a portion, the brighter the portion, and the smaller the amount of heat generation (the lower the temperature) of a portion, the darker the portion. FIG. 7B shows a current density distribution during a bipolar operation of the electrostatic protective element 101, in which the higher a current density, the darker, and the lower the current density, the brighter. In addition, dotted lines in the diagram indicate regions of the N-well 113 and the P-well 115.

As indicated by an arrow in FIG. 7B, when surface concentration of the electrostatic protective element 101 is high, a large current flows near the surface of the electrostatic protective element 101 between the collector contact 114 and the emitter contact 117. In particular, as indicated by the arrows in FIGS. 7A and 7B, current concentrates near a surface of the clearance 118 and an amount of heat generation increases. For example, a maximum value of the amount of heat generation near the arrow in FIG. 7A reaches $9.9 \times 10^{12}$ W/cm3.

As a result, a risk of thermal destruction of the electrostatic protective element 101 increases. Therefore, measures are desirably taken in order to alleviate the concentration of current near the surface of the electrostatic protective element 101.

<Configuration Example of Electrostatic Protective Element 101a>

Figure 8A:
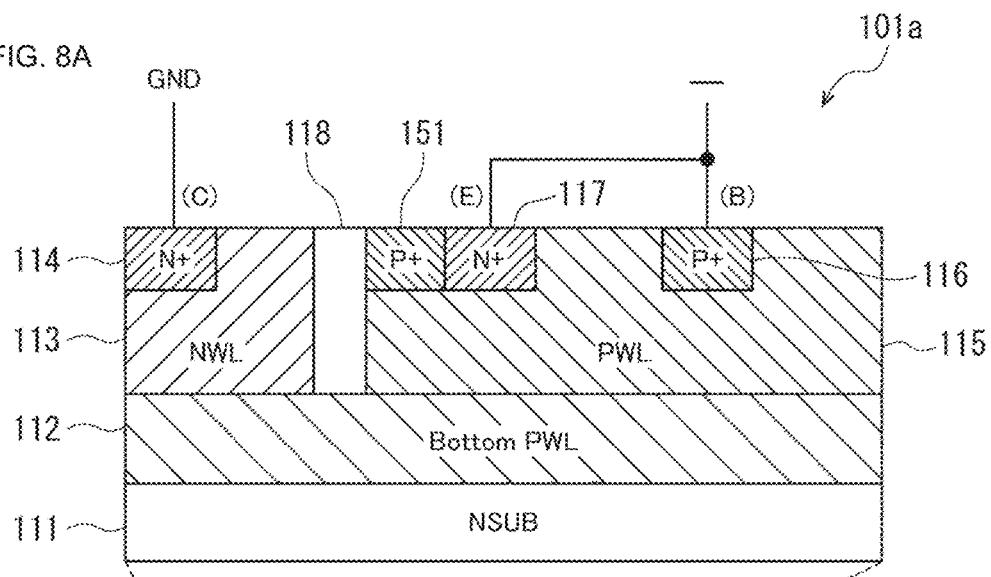
FIGS. 8A and 8B are sectional views and a plan view schematically showing a third embodiment of an electrostatic protective element to which the present technique has been applied.
Figure 8B:
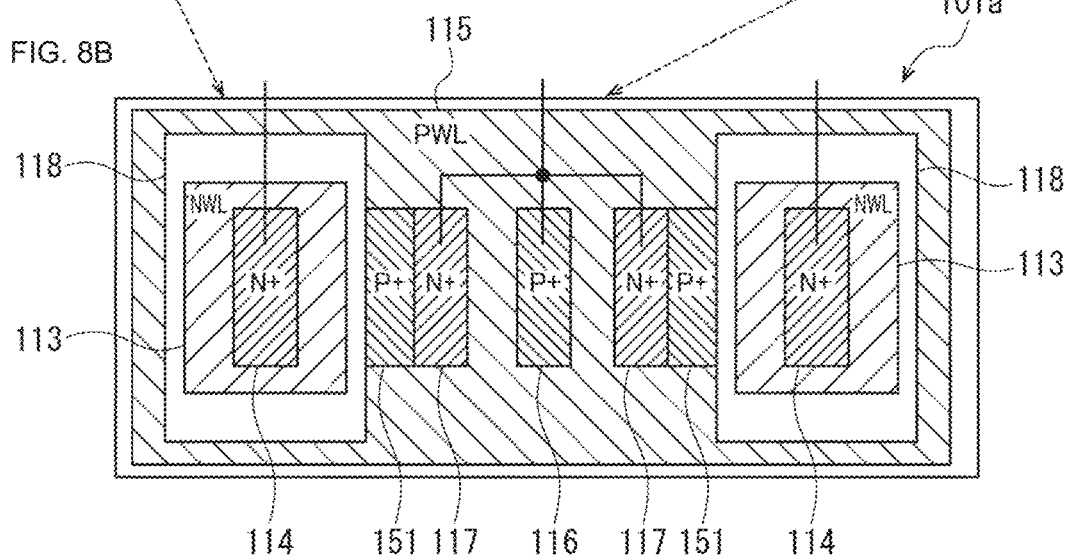

FIGS. 8A and 8B schematically show a configuration example of an electrostatic protective element 101a in which measures are taken in order to alleviate the concentration of current near the surface of the electrostatic protective element. FIG. 8A is a sectional views of the electrostatic protective element 101a and FIG. 8B is a plan view of the electrostatic protective element 101a.

It should be noted that two electrostatic protective elements 101a are shown in FIG. 8B. In addition, in the diagram, portions corresponding to those of the electrostatic protective element 101 shown in FIG. 3 are denoted by same reference signs and descriptions thereof will be omitted when appropriate.

The electrostatic protective element 101a differs from the electrostatic protective element 101 in that an impurity region 151 is formed.

The impurity region 151 is a P-type impurity region and has an impurity concentration which is similar to or higher than that of the emitter contact 117. The impurity region 151 is formed inside the P-well 115 on the front surface side of the semiconductor substrate 111 and at a position that is closer to the collector contact 114 than the emitter contact 117. The impurity region 151 is shallower and smaller in terms of an area in the horizontal direction than the P-well 115 and has approximately the same depth as the emitter contact 117.

It should be noted that a configuration example in which the base contact 116 is shared between two electrostatic protective elements 101a is shown in FIG. 8B.

Specifically, a periphery of the N-well 113 is enclosed by the clearance 118 and a periphery of the clearance 118 is enclosed by the P-well 115. The collector contact 114 is arranged approximately at a center of the N-well 113. The base contact 116 is arranged approximately at a center between two adjacent gaps 118 inside the P-well 115. The emitter contact 117 is arranged to the left and right of the base contact 116 so as to be separated from the base contact 116 by prescribed intervals. The impurity region 151 is arranged between the emitter contact 117 and the clearance 118.

The impurity region 151 may be or may not be in contact with the emitter contact 117. In addition, the impurity region 151 may be or may not be in contact with the clearance 118.

Figure 9A:
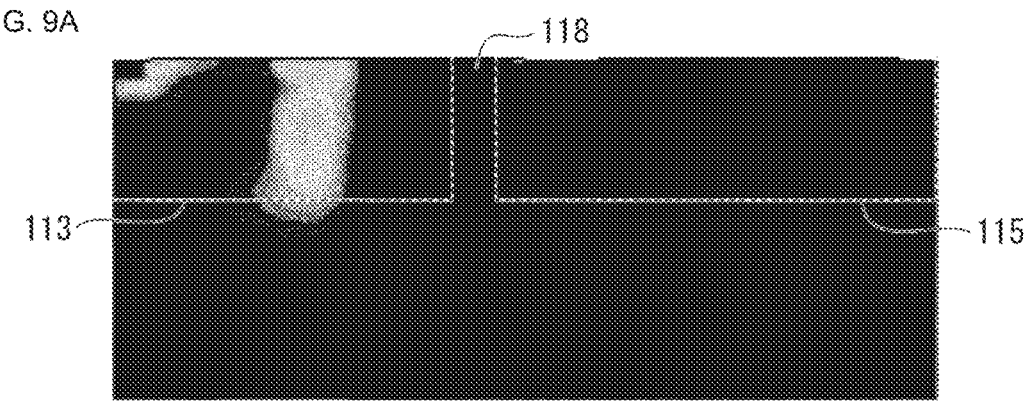
FIGS. 9A and 9B are diagrams showing a heat generation distribution and a current density distribution of the electrostatic protective element shown in FIGS. 8A and 8B.
Figure 9B:
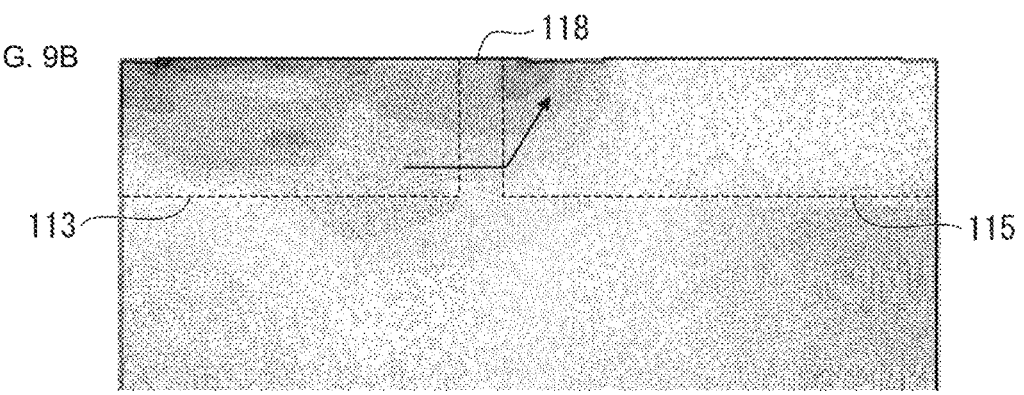

FIGS. 9A and 9B show an example of a heat generation distribution and a current density distribution of the electrostatic protective element 101a in a similar manner to FIGS. 7A and 7B.

Providing the impurity region 151 causes, as indicated by an arrow in FIG. 9B, a collector current to be routed to the emitter contact 117 from deep positions of the N-well 113 and the P-well 115. Accordingly, as shown in FIG. 9A, heat generation portions are dispersed as compared to FIG. 7A. For example, the maximum value of the amount of heat generation drops to 5.6×1011 W/cm3.

As a result, a risk of thermal destruction of the electrostatic protective element 101a is reduced. In addition, since a larger collector current (surge current) can be made to flow without causing thermal destruction, for example, the electrostatic protective element 101a can be downsized.

<<5. Fourth Embodiment>>

Next, a fourth embodiment of the present technique will be described with reference to FIGS. 10, 11A, 11 B, and 12.

Figure 10:
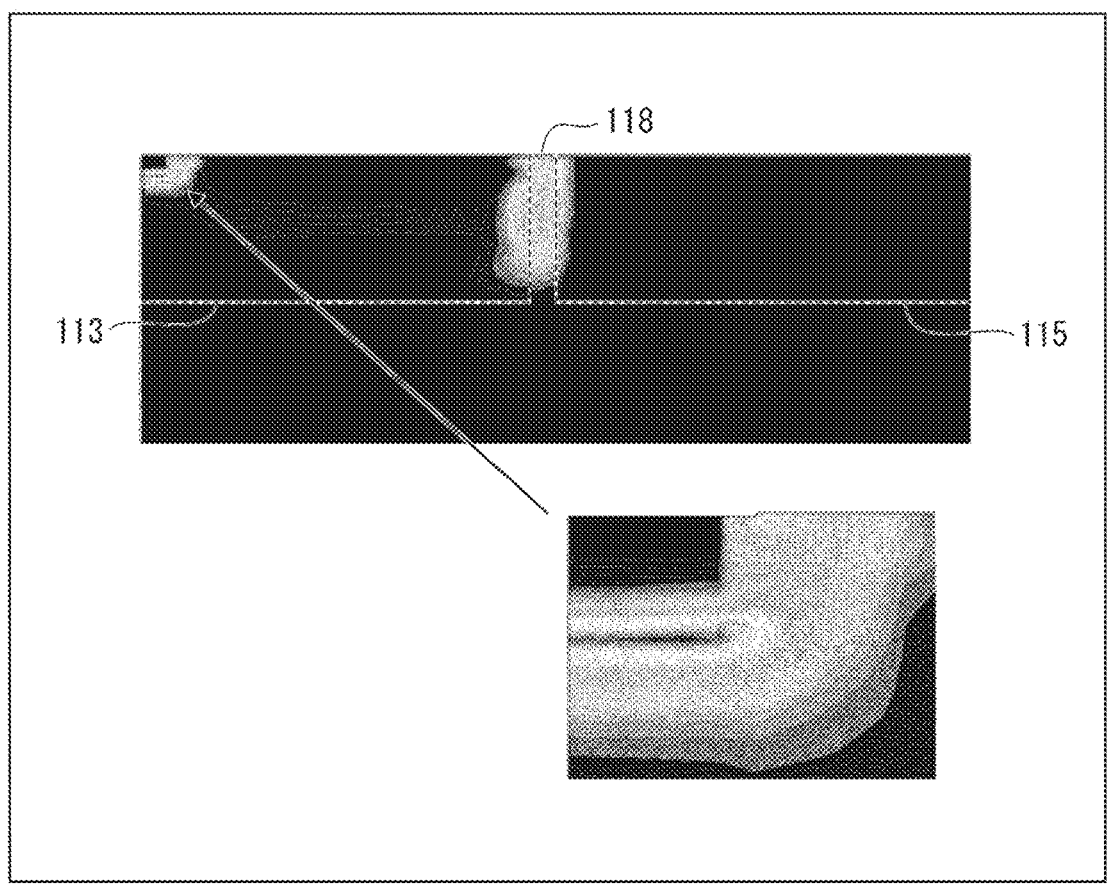
FIG. 10 is a diagram showing a heat generation distribution and a current density distribution when the surface density of the electrostatic protective element shown in FIG. 3 is low.

An upper diagram in FIG. 10 is a diagram similar to FIG. 7A and shows a heat generation distribution when the surface concentration of the electrostatic protective element 101 is low. A lower diagram in FIG. 10 represents an enlarged view of a portion (near a bottom right corner of the collector contact 114) that is indicated by an arrow in the upper diagram.

When the surface concentration of the electrostatic protective element 101 is low, since it is more difficult for current to flow on the surface of the electrostatic protective element 101, current is made to flow in a region that is slightly separated from the surfaces of the N-well 113 and the P-well 115. In particular, as shown in the enlarged view in FIG. 10, current concentrates near a bottom surface of the collector contact 114 and an amount of heat generation increases. For example, the maximum value of the amount of heat generation reaches $4.0 \times 10^{11}$ W/cm$^3$.

As a result, a risk of thermal destruction of the electrostatic protective element 101 increases. Therefore, measures are desirably taken in order to alleviate the concentration of current near the bottom surface of the collector contact 114 of the electrostatic protective element 101.

<Configuration Example of Electrostatic Protective Element 101b>

Figure 11:
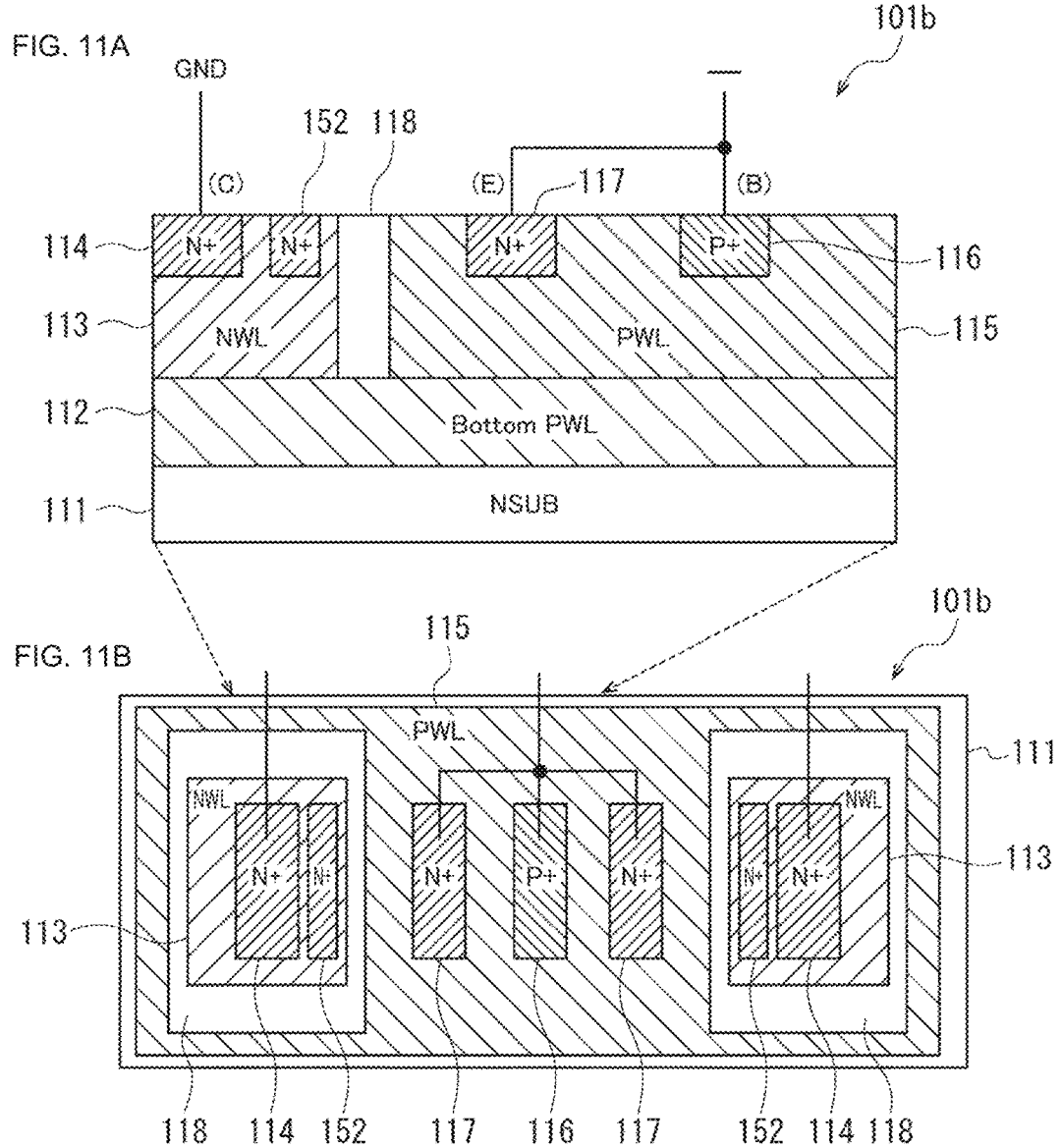
FIGS. 11A and 11B are sectional views and a plan view schematically showing a fourth embodiment of an electrostatic protective element to which the present technique has been applied.

FIGS. 11A and 11B schematically show a configuration example of an electrostatic protective element 101b in which measures are taken in order to alleviate the concentration of current near the bottom surface of the collector contact 114. FIG. 11A is a sectional view of the electrostatic protective element 101b and FIG. 11 B is a plan view of the electrostatic protective element 101b.

It should be noted that two electrostatic protective elements 101b are shown in FIG. 11B. In addition, in the diagram, portions corresponding to those of the electrostatic protective element 101 shown in FIG. 3 are denoted by same reference signs and descriptions thereof will be omitted when appropriate.

The electrostatic protective element 101b differs from the electrostatic protective element 101 in that an impurity region 152 is formed.

The impurity region 152 is an N-type impurity region and has an impurity concentration which is similar to or higher than the collector contact 114. The impurity region 152 is formed inside the N-well 113 on the front surface side of the semiconductor substrate 111 and at a position that is closer to the emitter contact 117 than the collector contact 114 so as to be separated by a predetermined interval in the horizontal direction from the collector contact 114. For example, the collector contact 114 and the impurity region 152 are arranged at positions that are separated in the horizontal direction so as to prevent contact from occurring in a diffusion step. The impurity region 152 is shallower and smaller in terms of an area in the horizontal direction than the N-well 113 and has approximately the same depth as the collector contact 114.

It should be noted that the impurity region 152 may be or may not be in contact with the clearance 118.

Figure 12:
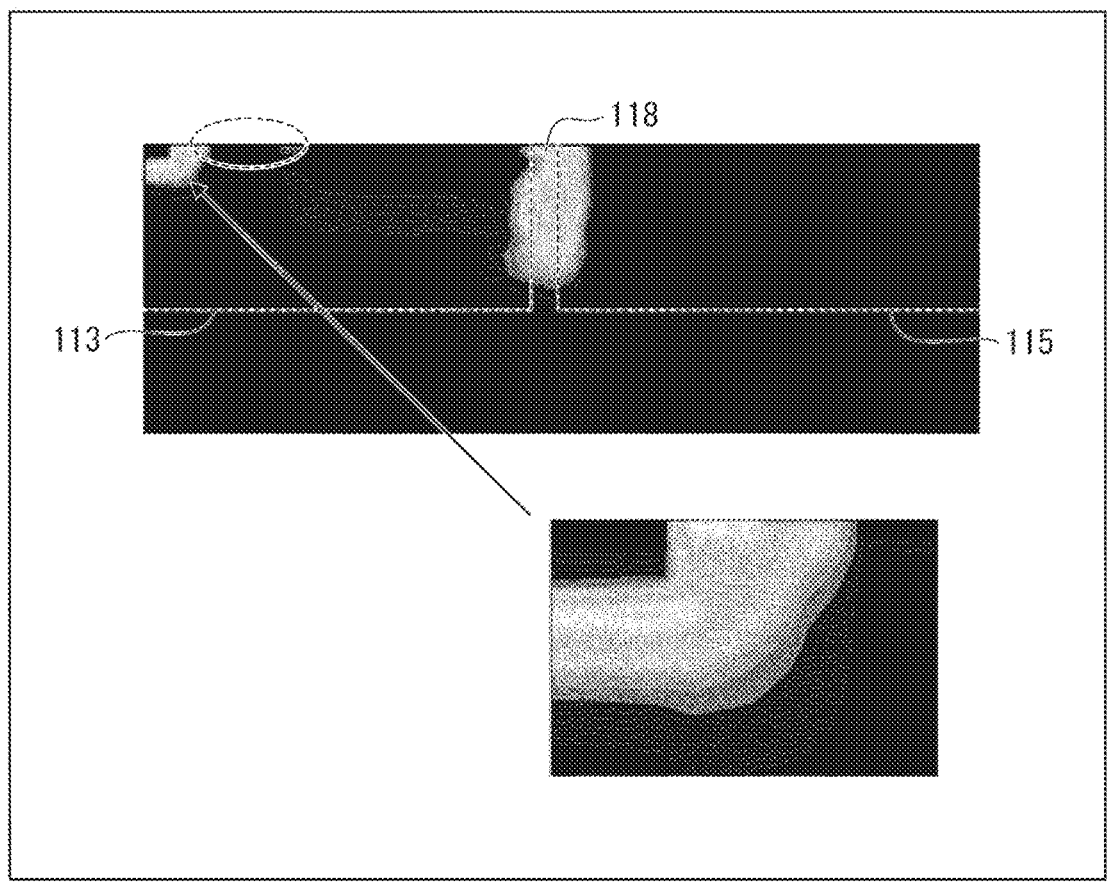
FIG. 12 is a diagram showing a heat generation distribution and a current density distribution of the electrostatic protective element shown in FIG. 10.

FIG. 12 shows an example of a heat generation distribution of the electrostatic protective element 101b in a similar manner to FIG. 10.

Compared to the example shown in FIG. 10, as indicated in a portion enclosed by a dotted oval in FIG. 12, a surface of the N-well 113 is generating heat in a portion that is adjacent to the collector contact 114. This is because providing the impurity region 152 increases current that flows into the surface of the N-well 113 from the collector contact 114. Accordingly, as shown in an enlarge view in FIG. 12, heat generation portions near the bottom surface of the collector contact 114 are dispersed as compared to the enlarged view in FIG. 10. For example, the maximum value of the amount of heat generation drops to $3.5 \times 10^{11}$ W/cm$^3$.

As a result, a risk of thermal destruction of the electrostatic protective element 101b is reduced. In addition, since a larger collector current (surge current) can be made to flow without causing thermal destruction, for example, the electrostatic protective element 101b can be downsized.

<<6. Fifth Embodiment>>

Next, a fifth embodiment of the present technique will be described with reference to FIGS. 13A and 13B. The fifth embodiment represents a combination of the third embodiment and the fourth embodiment.

<Configuration Example of Electrostatic Protective Element 101c>

Figure 13A:
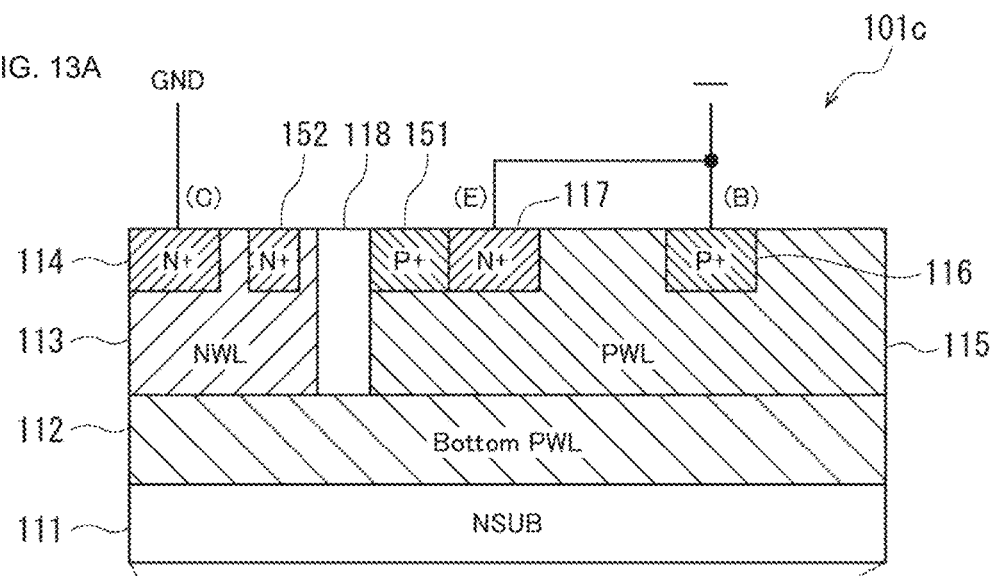
FIGS. 13A and 13B are sectional views and a plan view schematically showing a fifth embodiment of an electrostatic protective element to which the present technique has been applied.
Figure 13B:
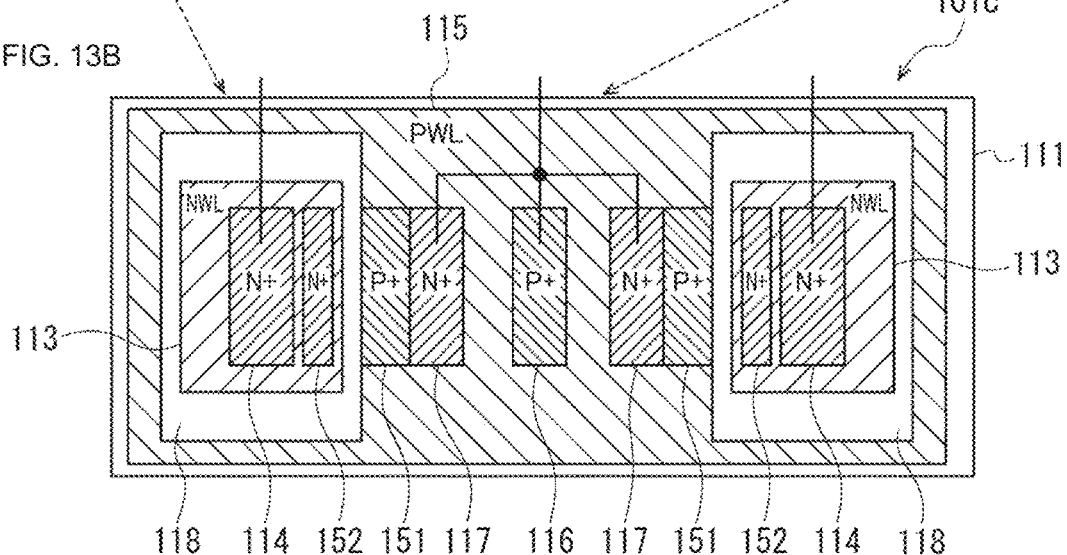

FIGS. 13A and 13B are sectional views and a plan view schematically showing a configuration example of an electrostatic protective element 101c that represents the fifth embodiment of the present technique. In the diagram, portions corresponding to those of the electrostatic protective element 101a shown in FIGS. 8A and 8B and the electrostatic protective element 101b shown in FIGS. 11A and 11B are denoted by same reference signs and descriptions thereof will be omitted when appropriate.

The electrostatic protective element 101c includes both the impurity region 151 of the electrostatic protective element 101a and the impurity region 152 of the electrostatic protective element 101b.

Accordingly, since a collector current flows in a more dispersed manner, the heat generation portions are more dispersed. As a result, a risk of thermal destruction of the electrostatic protective element 101c is further reduced. In addition, since a larger collector current (surge current) can be made to flow without causing thermal destruction, for example, the electrostatic protective element 101c can be further downsized.

<<7. Sixth Embodiment>>

Next, a sixth embodiment of the present technique will be described with reference to FIGS. 14A and 14B. The sixth embodiment represents reversed polarities of the impurity regions of the third embodiment.

<Configuration Example of Electrostatic Protective Element 201a>

Figure 14A:
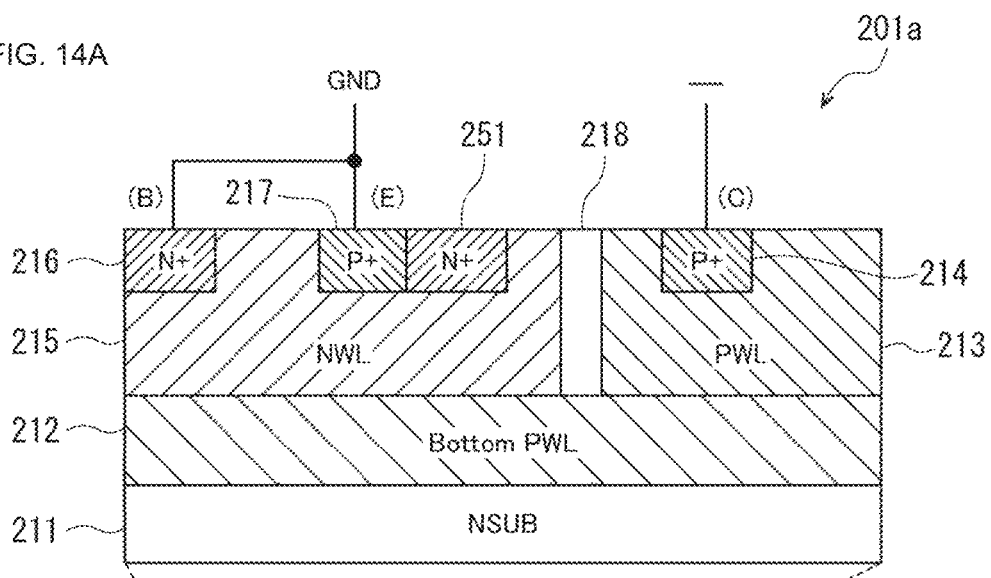
FIGS. 14A and 14B are sectional views and a plan view schematically showing a sixth embodiment of an electrostatic protective element to which the present technique has been applied.
Figure 14B:
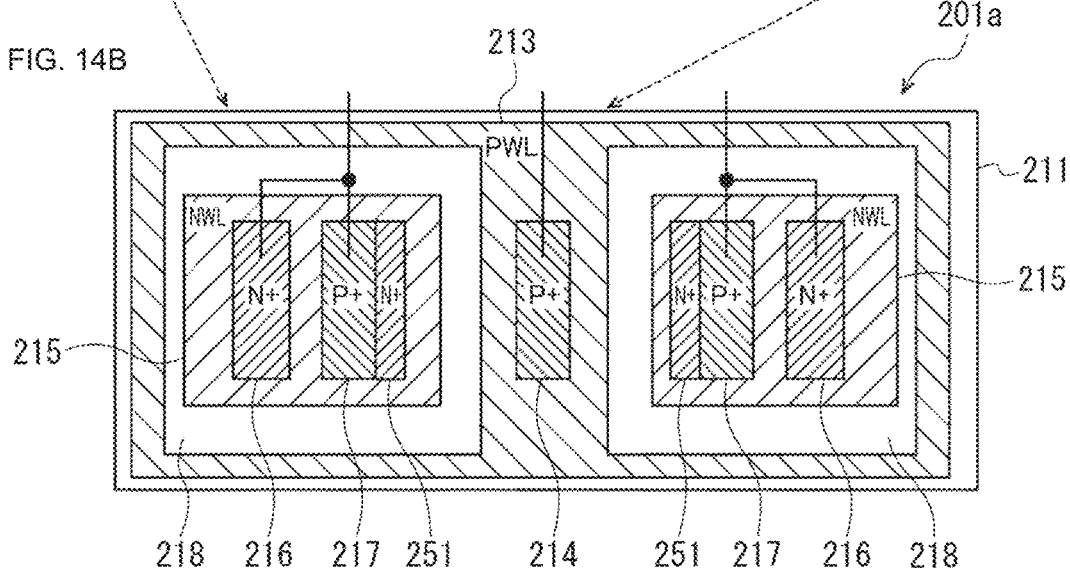

FIGS. 14A and 14B schematically show a configuration example of an electrostatic protective element 201a that represents the sixth embodiment of the present technique. FIG. 14A is a sectional view of the electrostatic protective element 201a and FIG. 14B is a plan view of the electrostatic protective element 201a.

It should be noted that two electrostatic protective elements 201a are shown in FIG. 14B. In addition, in the diagram, portions corresponding to those of the electrostatic protective element 201 shown in FIG. 5 are denoted by same reference signs and descriptions thereof will be omitted when appropriate.

The electrostatic protective element 201a differs from the electrostatic protective element 201 in that an impurity region 251 is formed.

The impurity region 251 is an N-type impurity region and has an impurity concentration which is similar to or higher than the emitter contact 217. The impurity region 251 is formed inside the N-well 113 on the front surface side of the semiconductor substrate 111 and at a position that is closer to the collector contact 214 than the emitter contact 217. The impurity region 251 is shallower and smaller in terms of an area in the horizontal direction than the N-well 215 and has approximately the same depth as the emitter contact 217.

It should be noted that a configuration example in which the collector contact 214 is shared between two electrostatic protective elements 201a is shown in FIG. 14B.

Specifically, a periphery of the N-well 215 is enclosed by the clearance 218 and a periphery of the clearance 218 is enclosed by the P-well 213. The collector contact 214 is arranged approximately at a center between two adjacent gaps 218 inside the P-well 213. Inside the N-well 215, the base contact 216, the emitter contact 217, and the impurity region 251 are arranged so as to line up to the left and right in a descending order of distance from the collector contact 214. A clearance is provided between the base contact 216 and the clearance 218 and between the base contact 216 and the emitter contact 217.

The impurity region 251 may be or may not be in contact with the emitter contact 217. In addition, the impurity region 251 may be or may not be in contact with the clearance 218.

The electrostatic protective element 201a represents reverse polarities of the impurity regions of the electrostatic protective element 101a shown in FIGS. 8A and 8B and is capable of producing operational advantages similar to those of the electrostatic protective element 101a. In other words, a risk of thermal destruction of the electrostatic protective element 201a is reduced. In addition, since a larger collector current (surge current) can be made to flow without causing thermal destruction, for example, the electrostatic protective element 201a can be downsized.

<<8. Seventh Embodiment>>

Next, a seventh embodiment of the present technique will be described with reference to FIGS. 15A and 15B. The seventh embodiment represents reversed polarities of the impurity regions of the fourth embodiment.

<Configuration Example of Electrostatic Protective Element 201b>

Figure 15A:
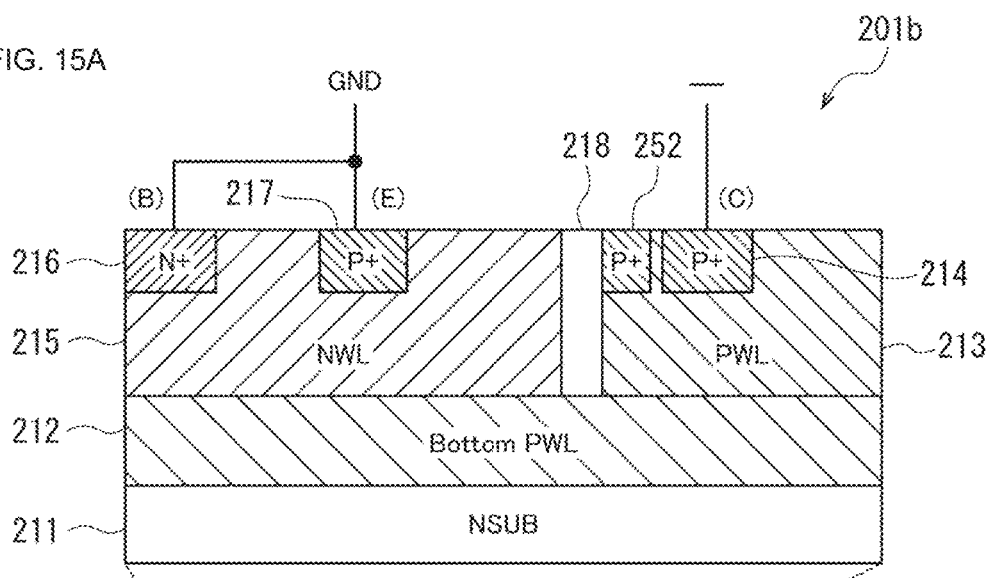
FIGS. 15A and 15B are sectional views and a plan view schematically showing a seventh embodiment of an electrostatic protective element to which the present technique has been applied.
Figure 15B:
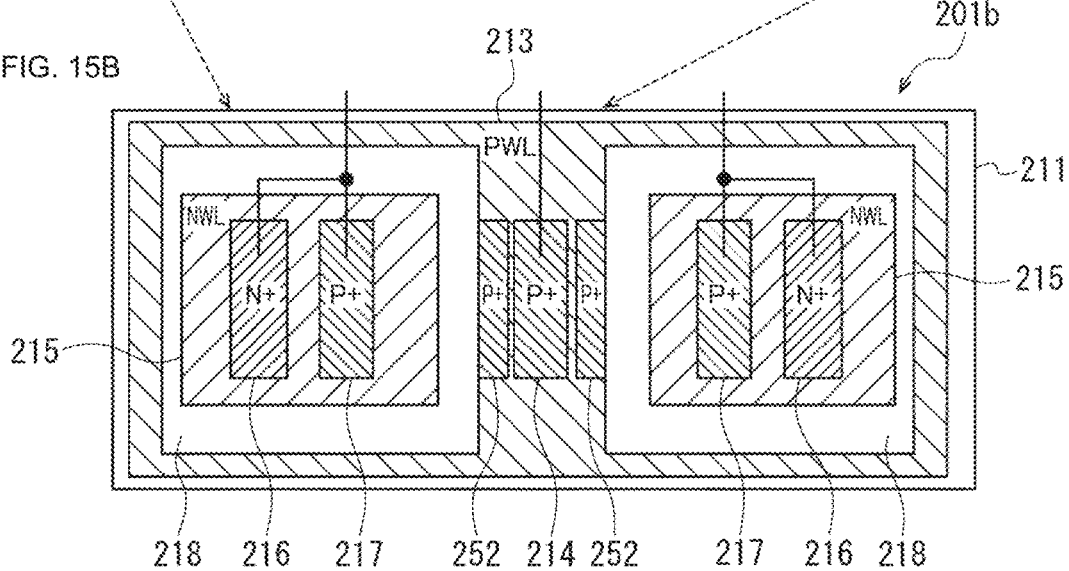

FIGS. 15A and 15B schematically show a configuration example of an electrostatic protective element 201b that represents the seventh embodiment of the present technique. FIG. 15A is a sectional view of the electrostatic protective element 201b and FIG. 15A is a plan view of the electrostatic protective element 201b.

It should be noted that two electrostatic protective elements 201b are shown in FIG. 15B. In addition, in the diagram, portions corresponding to those of the electrostatic protective element 201 shown in FIG. 5 are denoted by same reference signs and descriptions thereof will be omitted when appropriate.

The electrostatic protective element 201b differs from the electrostatic protective element 201 in that an impurity region 252 is formed.

The impurity region 252 is a P-type impurity region and has an impurity concentration which is similar to or higher than the collector contact 214. The impurity region 251 is formed inside the P-well 1213 on the front surface side of the semiconductor substrate 211 and at a position that is closer to the emitter contact 217 than the collector contact 214 so as to be separated by a predetermined interval in the horizontal direction from the collector contact 214. For example, the collector contact 214 and the impurity region 252 are arranged at positions that are separated in the horizontal direction so as to prevent contact from occurring in a diffusion step. The impurity region 252 is shallower and smaller in terms of an area in the horizontal direction than the P-well 213 and has approximately the same depth as the collector contact 214.

It should be noted that the impurity region 252 may be or may not be in contact with the clearance 218.

The electrostatic protective element 201b represents reverse polarities of the impurity regions of the electrostatic protective element 101b shown in FIGS. 11A and 11B and is capable of producing operational advantages similar to those of the electrostatic protective element 101b. In other words, a risk of thermal destruction of the electrostatic protective element 201b is reduced. In addition, since a larger collector current (surge current) can be made to flow without causing thermal destruction, for example, the electrostatic protective element 201b can be downsized.

<<9. Eighth Embodiment>>

Next, an eighth embodiment of the present technique will be described with reference to FIGS. 16A and 16B. The eighth embodiment represents a combination of the sixth embodiment and the seventh embodiment.

<Configuration Example of Electrostatic Protective Element 201c>

Figure 16A:
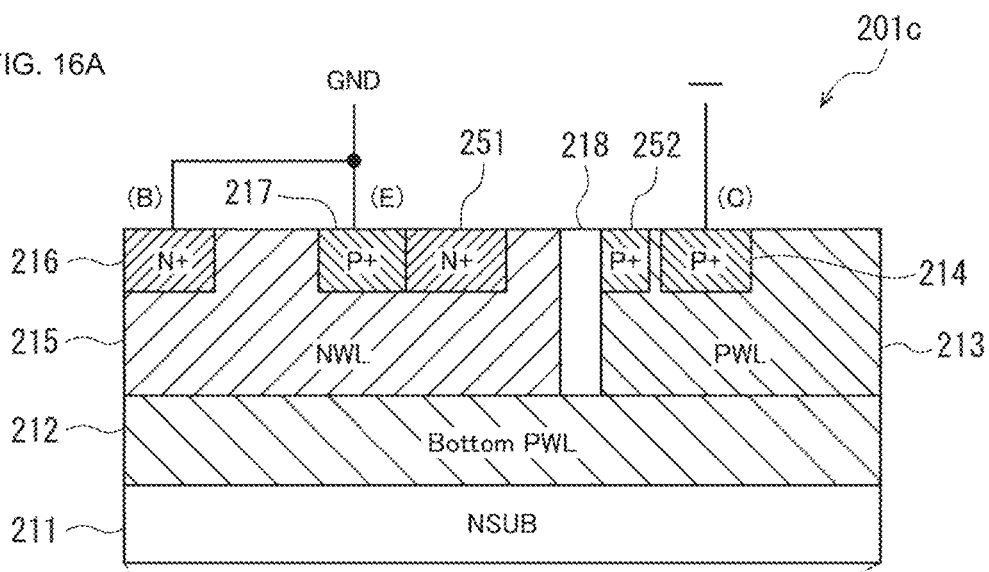
FIGS. 16A and 16B are sectional views and a plan view schematically showing an eighth embodiment of an electrostatic protective element to which the present technique has been applied.
Figure 16B:
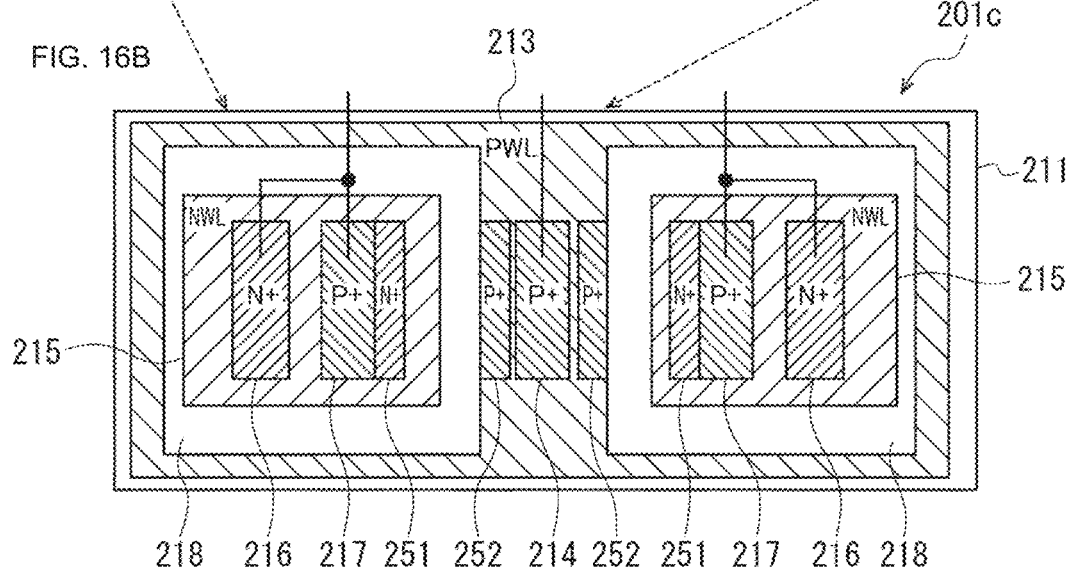

FIGS. 16A and 16B are sectional views and a plan view schematically showing a configuration example of an electrostatic protective element 201c that represents the eighth embodiment of the present technique. In the diagram, portions corresponding to those of the electrostatic protective element 201a shown in FIGS. 14A and 14B and the electrostatic protective element 201b shown in FIGS. 15A and 15B are denoted by same reference signs and descriptions thereof will be omitted when appropriate.

The electrostatic protective element 201c includes both the impurity region 251 of the electrostatic protective element 201a and the impurity region 252 of the electrostatic protective element 201b.

Accordingly, since a collector current flows in a more dispersed manner, the heat generation portions are more dispersed. As a result, a risk of thermal destruction of the electrostatic protective element 201c is further reduced. In addition, since a larger collector current (surge current) can be made to flow without causing thermal destruction, for example, the electrostatic protective element 201c can be further downsized.

10. Ninth Embodiment

Next, a ninth embodiment of the present technique will be described with reference to FIG. 17.

In the ninth embodiment, the electrostatic protective element 101 shown in FIG. 3 is constituted by a multi-finger (multi-emitter).

<Configuration Example of Electrostatic Protective Element 101d>

Figure 17:
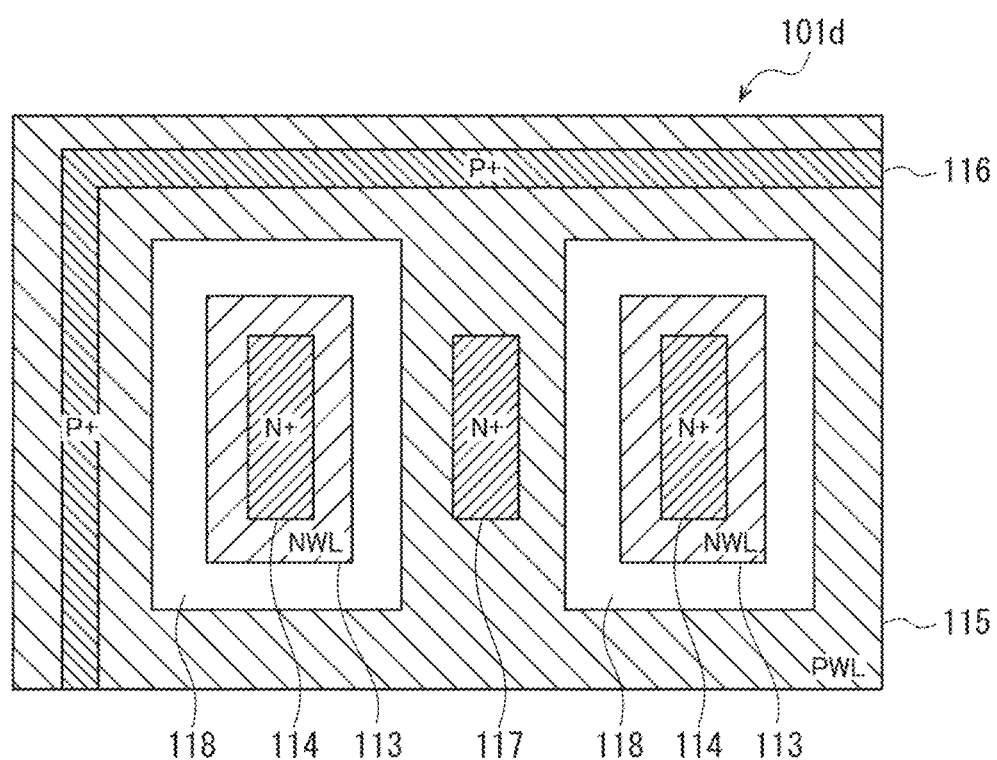
FIG. 17 is a sectional view and a plan view schematically showing a ninth embodiment of an electrostatic protective element to which the present technique has been applied.

FIG. 17 is a plan view schematically showing a configuration example of an electrostatic protective element 101d that represents the ninth embodiment of the present technique.

It should be noted that two electrostatic protective elements 101d are shown in FIG. 17. In addition, in the diagram, portions corresponding to those of the electrostatic protective element 101 shown in FIG. 3 are denoted by same reference signs and descriptions thereof will be omitted when appropriate.

A periphery of the N-well 113 is enclosed by the clearance 118 and a periphery of the clearance 118 is enclosed by the P-well 115. The collector contact 114 is arranged approximately at a center of the N-well 113. The base contact 116 is arranged so as to enclose a part of a periphery of the two gaps 118 inside the P-well 115. The emitter contact 117 is arranged approximately at a center between the two adjacent gaps 118 inside the P-well 115.

The base contact 116 and the emitter contact 117 are shared by the two electrostatic protective elements 101d.

11. Tenth Embodiment

Next, a tenth embodiment of the present technique will be described with reference to FIG. 18.

In the tenth embodiment, the electrostatic protective element 101c shown in FIGS. 13A and 13B are constituted by a multi-finger (multi-emitter).

<Configuration Example of Electrostatic Protective Element 101e>

Figure 18:
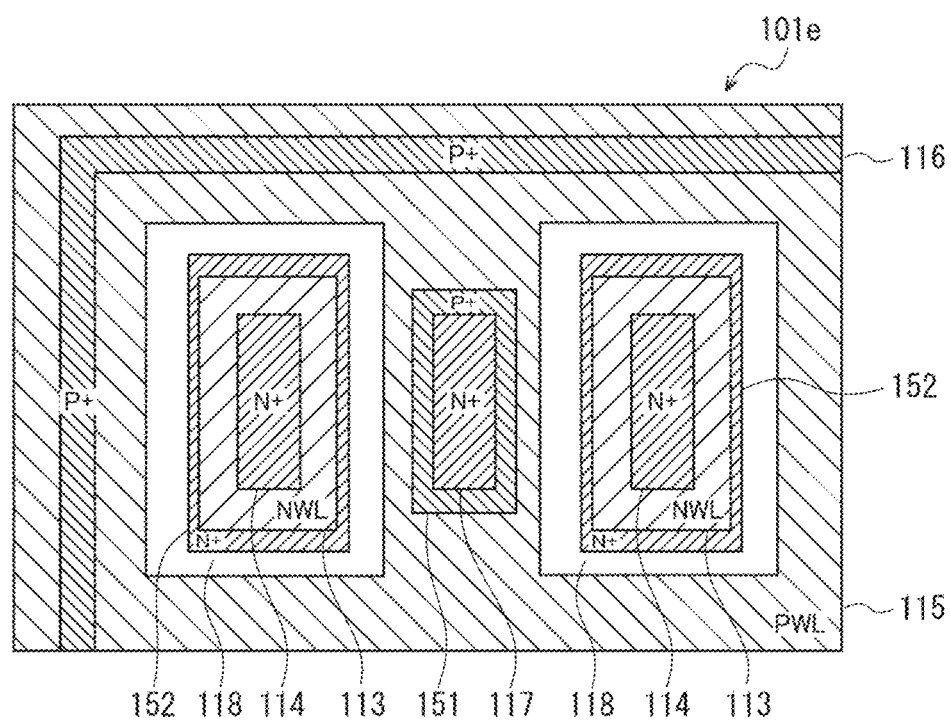
FIG. 18 is a sectional view and a plan view schematically showing a tenth embodiment of an electrostatic protective element to which the present technique has been applied.

FIG. 18 is a plan view schematically showing a configuration example of an electrostatic protective element 101e that represents the tenth embodiment of the present technique.

It should be noted that two electrostatic protective elements 101e are shown in FIG. 18. In addition, in the diagram, portions corresponding to those of the electrostatic protective element 101c shown in FIGS. 13A and 13B and the electrostatic protective element 101d shown in FIG. 17 are denoted by same reference signs and descriptions thereof will be omitted when appropriate.

The electrostatic protective element 101e differs from the electrostatic protective element 101d in that the impurity region 151 and the impurity region 152 are provided.

The impurity region 151 encloses a periphery of the emitter contact 117. A periphery of the impurity region 151 is enclosed by the P-well 115.

The impurity region 152 encloses a periphery of the N-well 113. A periphery of the impurity region 152 is enclosed by the clearance 118.

<<12. Eleventh Embodiment>>

Next, an eleventh embodiment of the present technique will be described with reference to FIGS. 19, 20, 21A, and 21B.

<Configuration Example of Electrostatic Protective Element 101f>

Figure 19:
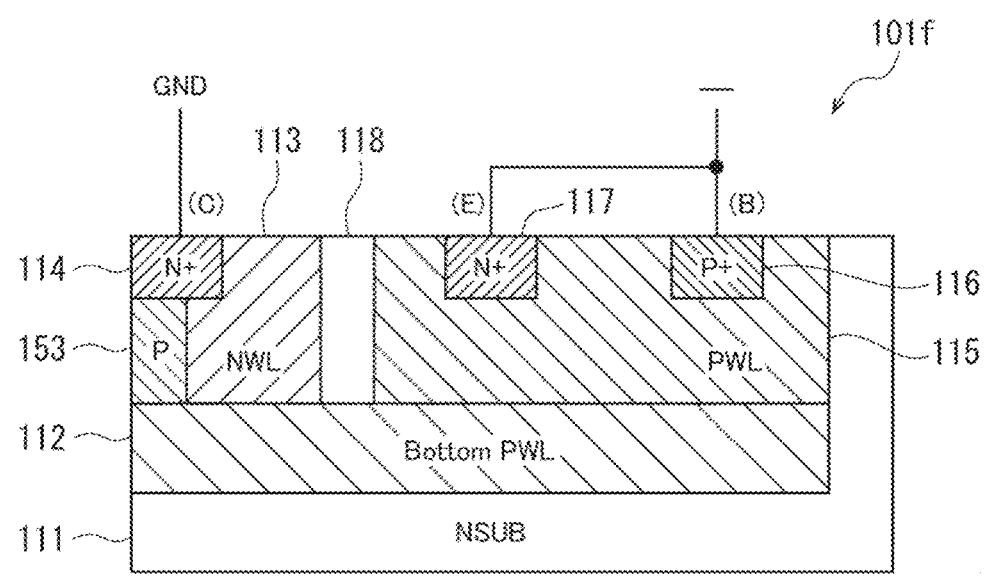
FIG. 19 is a sectional view schematically showing an eleventh embodiment of an electrostatic protective element to which the present technique has been applied.

FIG. 19 schematically shows a configuration example of the electrostatic protective element 101a in which measures are taken in order to alleviate the concentration of current near the surface of the electrostatic protective element.

In the diagram, portions corresponding to those of the electrostatic protective element 101 shown in FIG. 3 are denoted by same reference signs and descriptions thereof will be omitted when appropriate.

The electrostatic protective element 101f differs from the electrostatic protective element 101 in that an impurity region 153 is formed.

The impurity region 153 is a P-type impurity region and has an impurity concentration which is similar to the N-well 112 and which is lower than the collector contact 114. The impurity region 153 is formed between the collector contact 114 and the bottom P-well 112 and is in contact with a bottom surface of the impurity region 153 and a surface of the bottom P-well 112. An area in the horizontal direction of the impurity region 153 is equal to or smaller than an area in the horizontal direction of the collector contact 111. Therefore, all of or a part of the bottom surface of the collector contact 114 (at least a part of the bottom surface of the collector contact 114) is covered by the impurity region 153.

Figure 20:
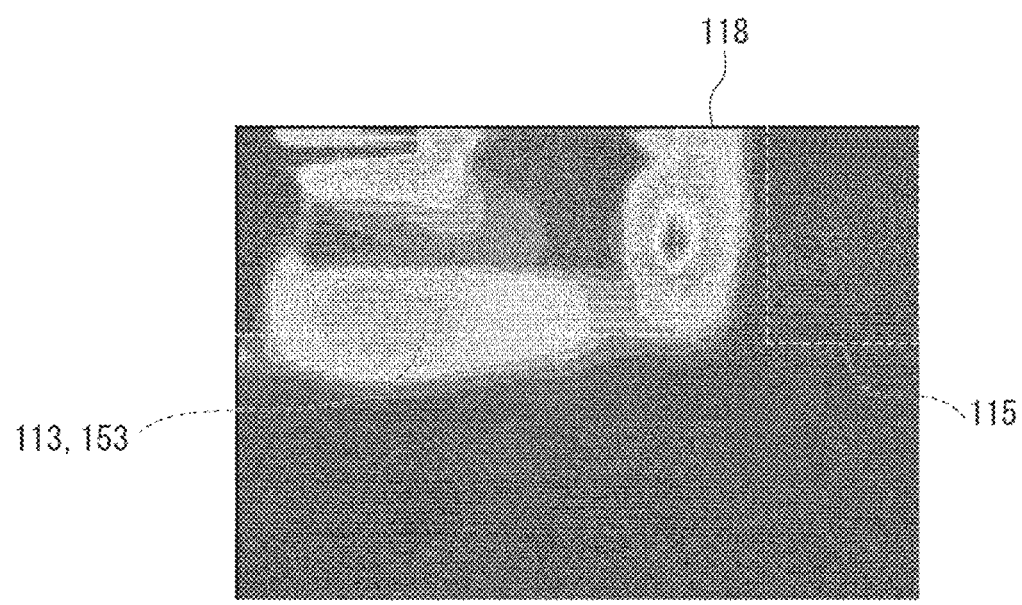
FIG. 20 is a diagram showing a heat generation distribution of the electrostatic protective element shown in FIG. 19.
Figure 21A:
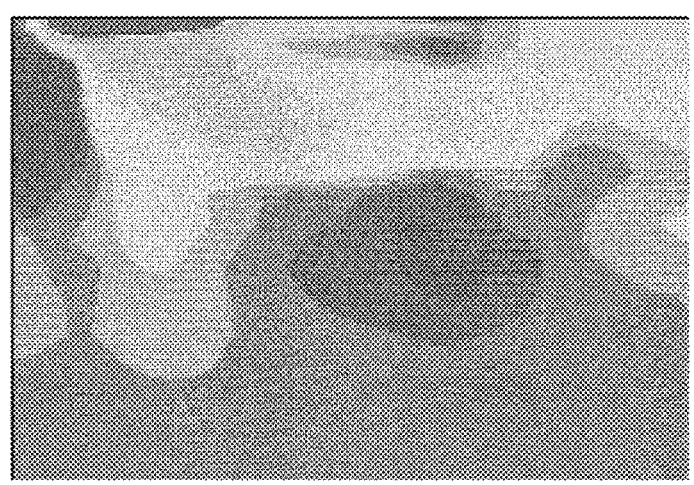
FIGS. 21A and 21B are diagrams showing a current density distribution and an electric field intensity distribution of the electrostatic protective element shown in FIG. 19.
Figure 21B:
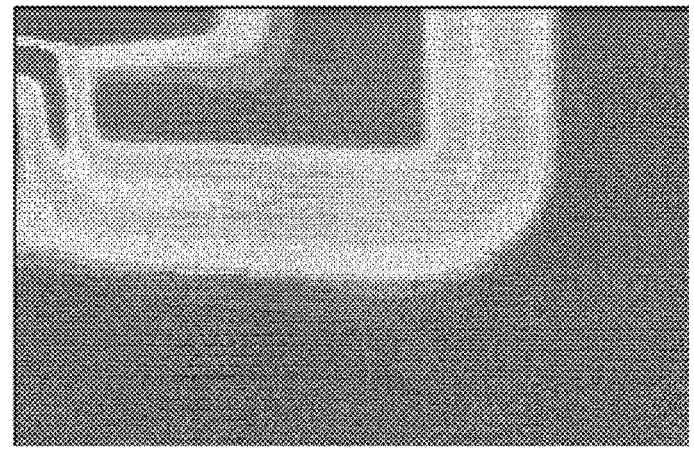

FIG. 20 shows an example of a heat generation distribution during a bipolar operation of the electrostatic protective element 101f in a similar manner to FIG. 7A. Dotted lines in the diagram indicate regions of the N-well 113, the impurity region 113, and the P-well 115. FIG. 21A shows an example of a current density distribution during a bipolar operation of the electrostatic protective element 101f in a similar manner to FIG. 7B. FIG. 21B shows an example of an electric field intensity distribution during a bipolar operation of the electrostatic protective element 101f, in which the higher an electric field intensity, the darker, and the lower the electric field intensity, the brighter.

Due to the formation of the impurity region 153, as shown in in FIGS. 21A and 21B, current and electric fields concentrate in different portions during a bipolar operation. Specifically, while current concentrates near a surface of the N-well 113, electric fields concentrate near a bottom surface of the N-well 113. Accordingly, heat generation portions (current×electric field) are dispersed and, for example, the maximum value of the amount of heat generation drops to $2.3 \times 10^{11}$ W/cm3.

As a result, a risk of thermal destruction of the electrostatic protective element 101f is reduced. In addition, since a larger collector current (surge current) can be made to flow without causing thermal destruction, for example, the electrostatic protective element 101f can be downsized.

Although not illustrated, for example, in the electrostatic protective element 201 shown in FIG. 5, an N-type impurity region may be provided between the collector contact 214 and the bottom P-well 212 in a similar manner to the impurity region 153 of the electrostatic protective element 101*f* shown in FIG. 19.

13. Modifications

For example, a P-type semiconductor substrate and an N-type bottom N-well can be used in place of the N-type semiconductor substrate and the P-type bottom P-well.

In addition, the respective embodiments of the present technique can be combined to the extent feasible.

14. Other

<Applications>

The electrostatic protective elements described above can be applied to, for example, various electronic devices provided with semiconductor apparatuses that require protection from static electricity.

Figure 22:
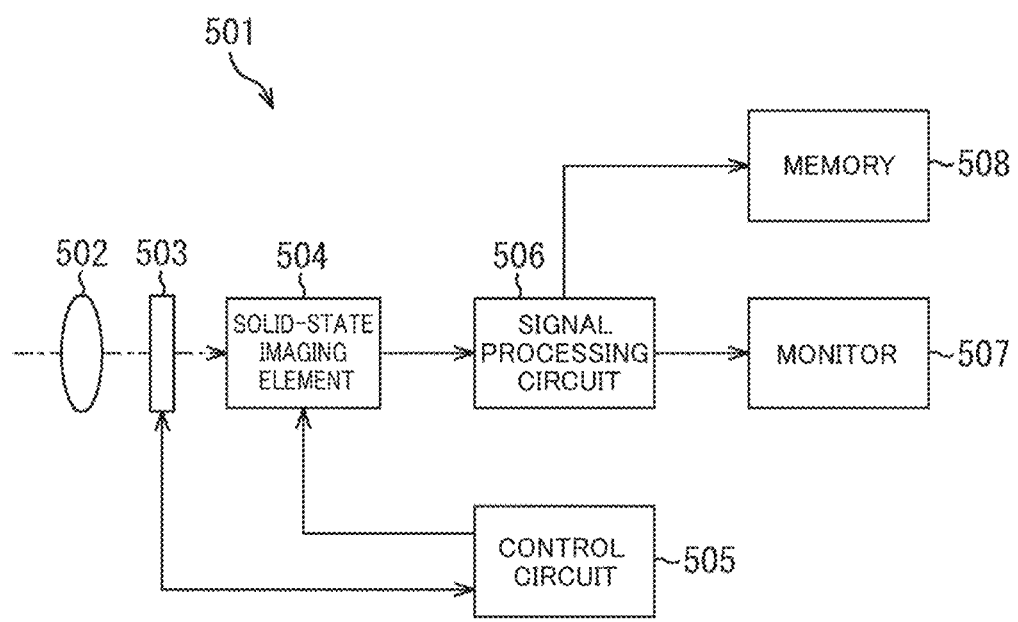
FIG. 22 is a block diagram showing a configuration example of an image pickup apparatus.

FIG. 22 is a block diagram showing a configuration example of an image pickup apparatus as an electronic device to which the present technique is applied.

An image pickup apparatus 501 shown in FIG. 22 includes an optical system 502, a shutter apparatus 503, a solid-state imaging element 504, a drive circuit 505, a signal processing circuit 506, a monitor 507, and a memory 508 and is capable of capturing still images and moving images.

The optical system 502 is configured so as to have a single lens or a plurality of lenses, guides light (incident light) from a subject to the solid-state imaging element 504, and causes an image to be formed on a light-receiving surface of the solid-state imaging element 504.

The shutter apparatus 503 is arranged between the optical system 502 and the solid-state imaging element 504 and controls a light irradiation period and a shading period with respect to the solid-state imaging element 504 in accordance with control of the drive circuit 505.

The solid-state imaging element 504 accumulates signal charges for a certain period in accordance with light that is focused on the light-receiving surface via the optical system 502 and the shutter apparatus 503. The signal charges accumulated in the solid-state imaging element 504 are transferred in accordance with a drive signal (a timing signal) that is supplied from the drive circuit 505.

The drive circuit 505 outputs drive signals that control a transfer operation by the solid-state imaging element 504 and a shutter operation by the shutter apparatus 503 and drives the solid-state imaging element 504 and the shutter apparatus 503.

The signal processing circuit 506 performs various kinds of signal processing with respect to the signal charges output from the solid-state imaging element 504. An image (image data) obtained as a result of the signal processing circuit 506 performing signal processing is supplied to and displayed by the monitor 507 or supplied to and stored (recorded) in the memory 508.

For example, the electrostatic protective element according to any of the embodiments described above can be applied to the solid-state imaging element 504 that is a semiconductor apparatus. In addition, for example, the electrostatic protective elements according to the embodiments described above can be applied to the control circuit 505 and the signal processing circuit 506.

<Examples of Configuration Combinations>

In addition, for example, the present technique can also be configured as follows.

(1)
An electrostatic protective element, including:
a first impurity region of a first conductivity type which is formed on a predetermined surface side of a semiconductor substrate;
a second impurity region of a second conductivity type which is formed on the predetermined surface side of the semiconductor substrate so as to form a clearance in a horizontal direction with respect to the first impurity region;
a collector contact which is formed on a predetermined surface side in the first impurity region, which has a higher concentration than the first impurity region, and which is an impurity region of the first conductivity type;
a base contact which is formed on a predetermined surface side in the second impurity region, which has a higher concentration than the second impurity region, and which is an impurity region of the second conductivity type; and
an emitter contact which is formed on a predetermined surface side in the second impurity region at a position that is closer to the collector contact than the base contact, which has a higher concentration than the second impurity region, and which is an impurity region of the first conductivity type.

(2)
The electrostatic protective element according to (1), further including
a third impurity region of the second conductivity type which is formed at a position that is closer to the collector contact than the emitter contact on a predetermined surface side in the second impurity region and which has a higher concentration than the second impurity region.

(3)
The electrostatic protective element according to (2), further including
a fourth impurity region of the first conductivity type which is formed at a position that is closer to the emitter contact than the collector contact on a predetermined surface side in the first impurity region and which has a higher concentration than the first impurity region.

(4)
The electrostatic protective element according to (2) or (3), wherein
the third impurity region has approximately the same depth as the emitter contact.

(5)
The electrostatic protective element according to any one of (2) to (4), wherein
an impurity concentration of the third impurity region is equal to or higher than that of the emitter contact.

(6)
The electrostatic protective element according to (1), further including
a fourth impurity region of the first conductivity type which is formed at a position that is closer to the emitter contact than the collector contact on a predetermined surface side of the first impurity region and which has a higher concentration than the first impurity region.

(7)
The electrostatic protective element according to (6), wherein
the fourth impurity region has approximately the same depth as the collector contact.

(8)
The electrostatic protective element according to (6) or (7), wherein
an impurity concentration of the fourth impurity region is equal to or higher than that of the collector contact.

(9)
The electrostatic protective element according to any one of (6) to (8), wherein
the collector contact and the fourth impurity region are arranged at positions that are separated from each other in the horizontal direction.

(10)
The electrostatic protective element according to any one of (1) to (9), wherein
the first impurity region and the second impurity region have approximately the same depth.

(11)
The electrostatic protective element according to any one of (1) to (10), further including
a fifth impurity region which at least covers a bottom surface of the first impurity region and a bottom surface of the second impurity region at a position that is deeper than the first impurity region and the second impurity region of the semiconductor substrate and which has a lower concentration than the first impurity region and the second impurity region.

(12)
The electrostatic protective element according to (11), further including
a sixth impurity region of the second conductivity type which is formed between the collector contact and the fifth impurity region, which covers at least a part of a bottom surface of the collector contact, and which has a lower concentration than the collector contact.

(13)
An electronic device including
a semiconductor apparatus that is provided with an electrostatic protective element, wherein
the electrostatic protective element includes:
a first impurity region of a first conductivity type which is formed on a predetermined surface side of a semiconductor substrate;
a second impurity region of a second conductivity type which is formed on the predetermined surface side of the semiconductor substrate so as to form a clearance in a horizontal direction with respect to the first impurity region;
a collector contact which is formed on a predetermined surface side in the first impurity region, which has a higher concentration than the first impurity region, and which is an impurity region of the first conductivity type;
a base contact which is formed on a predetermined surface side in the second impurity region, which has a higher concentration than the second impurity region, and which is an impurity region of the second conductivity type; and
an emitter contact which is formed on a predetermined surface side in the second impurity region at a position that is closer to the collector contact than the base contact, which has a higher concentration than the second impurity region, and which is an impurity region of the first conductivity type.

It should be noted that the advantageous effects described in the present specification are merely exemplary and are not restrictive, and other advantageous effects may be produced.

REFERENCE SIGNS LIST 101 to 101f Electrostatic protective element
111 Semiconductor substrate
112 Bottom P-well
113 N-well
114 Collector contact
115 P-well
116 Base contact
117 Emitter contact
118 Clearance
151, 152, 156 Impurity region
201 to 201c Electrostatic protective element
211 Semiconductor substrate
212 Bottom P-well
213 P-well
214 Collector contact
215 N-well
216 Base contact
217 Emitter contact
218 Clearance
251, 252 Impurity region
501 Image pickup apparatus
504 Solid-state imaging element

The invention claimed is:

1. An electrostatic protective element, comprising:
a first impurity region of a first conductivity type, wherein the first impurity region is on a specific surface side of a semiconductor substrate;
a second impurity region of a second conductivity type, wherein the second impurity region is on the specific surface side of the semiconductor substrate so as to form a clearance in a horizontal direction with respect to the first impurity region;
a collector contact on the specific surface side in the first impurity region,
wherein the collector contact has a higher concentration than the first impurity region, and the collector contact is an impurity region of the first conductivity type;
a base contact on the specific surface side in the second impurity region, wherein
the base contact has a higher concentration than the second impurity region, and
the base contact is an impurity region of the second conductivity type;
an emitter contact on the specific surface side in the second impurity region at a position that is closer to the collector contact than is the base contact, wherein
the emitter contact has a higher concentration than the second impurity region, and
the emitter contact is an impurity region of the first conductivity type;
a fifth impurity region which at least covers a bottom surface of the first impurity region and a bottom surface of the second impurity region at a position that is deeper than the first impurity region and the second impurity region of the semiconductor substrate, wherein the fifth impurity region has a lower concentration than the first impurity region and the second impurity region; and
a sixth impurity region of the second conductivity type, wherein
the sixth impurity region is between the collector contact and the fifth impurity region, and
the sixth impurity region covers at least a part of a bottom surface of the collector contact and has a lower concentration than the collector contact.

2. The electrostatic protective element according to claim 1, further comprising a third impurity region of the second conductivity type, wherein
the third impurity region is at a position that is closer to the collector contact than is the emitter contact on the specific surface side in the second impurity region, and
the third impurity region has a higher concentration than the second impurity region.

3. The electrostatic protective element according to claim 2, further comprising a fourth impurity region of the first conductivity type, wherein
  the fourth impurity region is at a position that is closer to the emitter contact than is the collector contact on the specific surface side in the first impurity region, and
  the fourth impurity region has a higher concentration than the first impurity region.

4. The electrostatic protective element according to claim 2, wherein a depth of the third impurity region is approximately same as a depth of the emitter contact.

5. The electrostatic protective element according to claim 2, wherein the impurity concentration of the third impurity region is equal to or higher than the impurity concentration of the emitter contact.

6. The electrostatic protective element according to claim 1, further comprising a fourth impurity region of the first conductivity type, wherein
  the fourth impurity region is at a position that is closer to the emitter contact than is the collector contact on the specific surface side of the first impurity region, and
  the fourth impurity region has a higher concentration than the first impurity region.

7. The electrostatic protective element according to claim 6, wherein a depth of the fourth impurity region is approximately same as a depth of the collector contact.

8. The electrostatic protective element according to claim 6, wherein the impurity concentration of the fourth impurity region is equal to or higher than the impurity concentration of the collector contact.

9. The electrostatic protective element according to claim 6, wherein a position of the collector contact is separated from the position of the fourth impurity region in the horizontal direction.

10. The electrostatic protective element according to claim 1, wherein a depth of the first impurity region is approximately same as a depth of the second impurity region.

11. An electronic device comprising
  a semiconductor apparatus that comprises an electrostatic protective element, wherein the electrostatic protective element includes:
    a first impurity region of a first conductivity type, wherein the first impurity region is on a specific surface side of a semiconductor substrate;
    a second impurity region of a second conductivity type, wherein the second impurity region is on the specific surface side of the semiconductor substrate so as to form a clearance in a horizontal direction with respect to the first impurity region;
    a collector contact on the specific surface side in the first impurity region, wherein
      the collector contact has a higher concentration than the first impurity region, and
      the collector contact is an impurity region of the first conductivity type;
    a base contact on the specific surface side in the second impurity region, wherein
      the base contact has a higher concentration than the second impurity region, and
      the base contact is an impurity region of the second conductivity type;
    an emitter contact on the specific surface side in the second impurity region at a position that is closer to the collector contact than is the base contact, wherein
      the emitter contact has a higher concentration than the second impurity region, and
      the emitter contact is an impurity region of the first conductivity type;
    a third impurity region which at least covers a bottom surface of the first impurity region and a bottom surface of the second impurity region at a position that is deeper than the first impurity region and the second impurity region of the semiconductor substrate, wherein the third impurity region has a lower concentration than the first impurity region and the second impurity region; and
    a fourth impurity region of the second conductivity type, wherein
      the fourth impurity region is between the collector contact and the third impurity region, and
      the fourth impurity region covers at least a part of a bottom surface of the collector contact and has a lower concentration than the collector contact.

* * * * *